US006954473B2

(12) United States Patent
Dehmubed et al.

(10) Patent No.: US 6,954,473 B2
(45) Date of Patent: Oct. 11, 2005

(54) OPTOELECTRONIC DEVICE EMPLOYING AT LEAST ONE SEMICONDUCTOR HETEROJUNCTION THYRISTOR FOR PRODUCING VARIABLE ELECTRICAL/OPTICAL DELAY

(75) Inventors: Rohinton Dehmubed, Hamden, CT (US); Geoff W. Taylor, Storrs-Mansfield, CT (US); Daniel C. Upp, Southbury, CT (US); Jianhong Cai, Nashua, NH (US)

(73) Assignees: Opel, Inc., Storrs-Mansfield, CT (US); The University of Connecticut, Farmington, CT (US)

( * ) Notice: Subject to any disclaimer, the term of this patent is extended or adjusted under 35 U.S.C. 154(b) by 14 days.

(21) Appl. No.: 10/280,892

(22) Filed: Oct. 25, 2002

(65) Prior Publication Data

US 2004/0081216 A1 Apr. 29, 2004

(51) Int. Cl.[7] .................................................. H01S 3/10
(52) U.S. Cl. ............................. 372/28; 372/43; 372/45; 372/46
(58) Field of Search ............................. 372/28, 46, 45, 372/50, 44; 257/13

(56) References Cited

U.S. PATENT DOCUMENTS

| 3,919,656 | A | 11/1975 | Sokal et al. .................. 330/51 |
| 4,424,525 | A | 1/1984 | Mimura ........................ 357/23 |
| 4,658,403 | A | 4/1987 | Takiguchi et al. ............ 372/96 |
| 4,683,484 | A | 7/1987 | Derkits, Jr. .................. 357/16 |
| 4,806,997 | A | 2/1989 | Simmons et al. ............. 357/16 |
| 4,814,774 | A | 3/1989 | Herczfeld .................... 432/372 |
| 4,827,320 | A | 5/1989 | Morkoc et al. ............... 357/22 |
| 4,829,272 | A | 5/1989 | Kameya ..................... 333/139 |

(Continued)

FOREIGN PATENT DOCUMENTS

WO    WO 02/071490    9/2002

OTHER PUBLICATIONS

*10–Gb/s High–Speed Monolithically Integrated Photoreceiver Using InGaAs p–I–n PD and Planar Doped InAlAs/InGaAs HEMT's* by Y. Akahori et al., IEEE Photonics Technology Letters, vol. 4, No. 7, Jul. 1992.

(Continued)

*Primary Examiner*—Minsun Oh Harvey
*Assistant Examiner*—Dung Nguyen
(74) *Attorney, Agent, or Firm*—Gordon & Jacobson, PC

(57) ABSTRACT

An optoelectronic integrated circuit includes a resonant cavity formed on a substrate. A heterojunction thyristor device is formed in the resonant cavity and operates to detect an input optical pulse (or input electrical pulse) and produce an output optical pulse via laser emission in response to the detected input pulse. The heterojunction thyristor device includes a channel region that is coupled to a current source that draws current from the channel region. Time delay between the input pulse and output optical pulse may be varied by configuring the current source to draw constant current from the channel region and modulating the intensity of the input pulse, or by varying the amount of current drawn from the channel region by the current source. The heterojunction thyristor device may be formed from a multilayer structure of group III–V materials, or from a multilayer structure of strained silicon materials. A plurality of such heterojunction thyristor based optoelectronic integrated circuits can be used to provide variable pulse delay over a plurality of channels. In addition, the heterojunction thyristor device is easily integrated with other optoelectronic devices formed from the same growth structure to form monolithic optoelectronic integrated circuits suitable for many diverse applications, including phased array communication systems.

30 Claims, 22 Drawing Sheets

U.S. PATENT DOCUMENTS

| | | | |
|---|---|---|---|
| 4,899,200 A | | 2/1990 | Shur et al. ..................... 357/30 |
| 4,949,350 A | | 8/1990 | Jewell et al. .................. 372/45 |
| 5,010,374 A | | 4/1991 | Cooke et al. .................. 357/16 |
| 5,105,248 A | | 4/1992 | Burke et al. .................. 357/24 |
| 5,202,896 A | | 4/1993 | Taylor ......................... 372/50 |
| 5,204,871 A | * | 4/1993 | Larkins ....................... 372/45 |
| 5,337,328 A | | 8/1994 | Lang et al. ................... 372/45 |
| 5,386,128 A | | 1/1995 | Fossum et al. ........... 257/183.1 |
| 5,422,501 A | | 6/1995 | Bayraktaroglu ............. 257/195 |
| 5,436,759 A | | 7/1995 | Dijaili et al. ............... 359/333 |
| 5,652,439 A | | 7/1997 | Kuijk et al. ................. 257/113 |
| 5,698,900 A | | 12/1997 | Bozada et al. .............. 257/744 |
| 6,031,243 A | * | 2/2000 | Taylor ......................... 257/13 |
| 6,647,041 B1 | * | 11/2003 | Verma et al. ................. 372/45 |
| 2001/0043629 A1 | * | 11/2001 | Sun et al. ..................... 372/43 |
| 2002/0067877 A1 | | 6/2002 | Braun et al. .................. 385/15 |

OTHER PUBLICATIONS

*10–Gbit/s InP–Based High–Performance Monolithic Photoreceivers Consisting of p–i–n Photodiodes and HEMT's* by Kiyoto Takahata et al., IEICE Trans. Electron., vol. E83–C, No. 6, Jun. 2000.

*10 Ghz Bandwidth Monolithic p–i–n Modulation–Doped Field Effect Transistor Photoreceiver* by N.K. Dutta et al., Appl. Phys. Lett., vol. 63, No. 15, Oct. 11, 1993.

*20 Gbit/s Long Wavelength Monolithic Integrated Photoreceiver Grown on GaAs* by V. Hurm et al., Electronic Letters, vol. 33, No. 7, Mar. 27, 1997.

*Heterojunction Field–Effect Transistor (HFET)* by G.W. Taylor et al., Electronics Letters, vol. 22, No. 15, pp. 784–786, Jul. 17, 1986.

*High Temperature Annealing of Modulation Doped GaAs/ AlGaAs Heterostructures for FET Applications* by H. Lee et al., 1983 IEEE/Cornell Conf. On High–Speed Semiconductor Devices & Ckts, Aug. 1983.

*Monolithic Integrated Optoelectronic Circuits* by M. Berroth et al., 0–7803–2442–0–8/95 IEEE, 1995.

*Submicrometre Gate Length Scaling of Inversion Channel Heterojunction Field Effect Transistor* by P.A. Kiely et al., Electronics Letters, vol. 30, No. 6, Mar. 17, 1994.

*Theoretical and Experimental Results for the Inversion Channel Heterostructure Field Effect Transistor* by G.W. Taylor et al., IEE Proceedings–G, vol. 140, No. 6, Dec. 1993.

\* cited by examiner

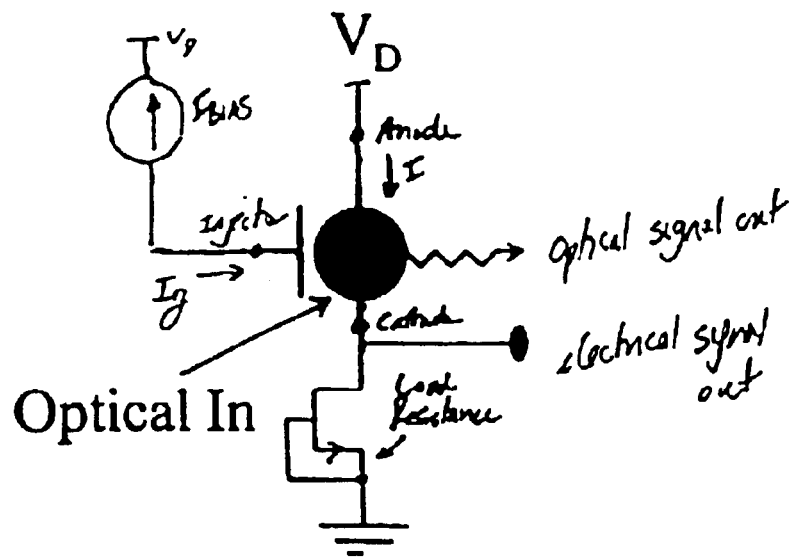
FIG. 1B1
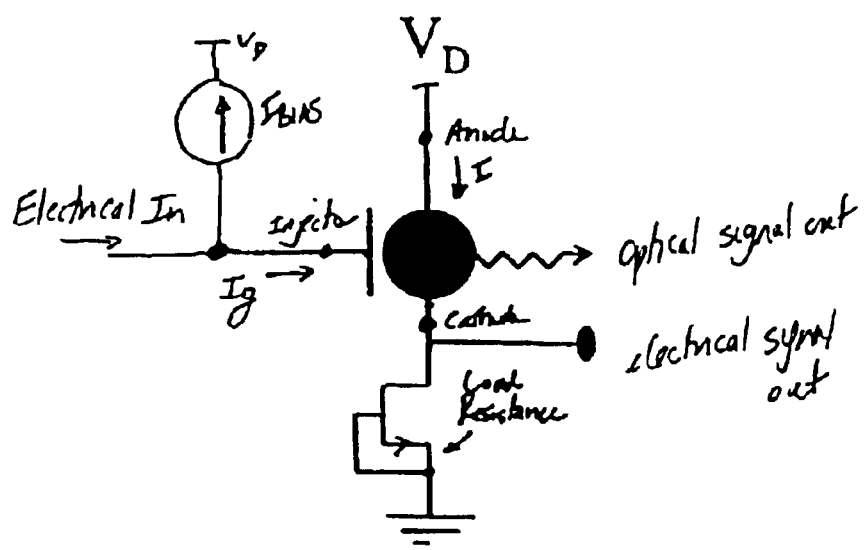
FIG. 1B2

① input pulse can be in the form of electrical or optical energy

② output pulse is in the form of electrical energy (at cathode terminal) and optical energy (ejected from the cavity)

| Layer | Material | Type | Doping | Thickness | Ref |
|---|---|---|---|---|---|
| 30 | InGaAs | P+ | 1E20 | 25 | 165b |
|  | GaAs | P+ | 1E20 | 75 | 165a |
| 28 { | Al(.7)Ga(.3)As | P | 1E17 | 700 | 164b |
|  | Al(.7)Ga(.3)As | P+ | 1E19 | 10 | 164a |
|  | Al(.15)Ga(.85)As | P+ | 3.5E18 | 25 | 163d |
| 26 { | Al(.15)Ga(.85)As |  | UD | 300 | 163c |
|  | Al(.15)Ga(.85)As | N+ | 3.5E18 | 80 | 163b |
|  | Al(.15)Ga(.85)As |  | UD | 30 | 163a |
|  | GaAs |  | UD | 15 | 162 |
| 24 { | In(.20)Ga(.80)AsN QW/ GaAs QW GaAs Barrier } ×3 |  | UD | 60 | 161 |
|  | GaAs |  | UD | 100 | 160b |
| 22 { | Al(.15)Ga(.85)As |  | UD | 150 | 160a |
|  | GaAs Barrier |  | UD | 5000 | 159 |
|  | In(.20)Ga(.80)AsN QW/GaAs QW } ×3 |  | UD | 100 | 158 |
|  | GaAs |  | UD | 60 | 157 |
| 20 { | Al(.15)Ga(.85)As |  | UD | 15 | 156 |
|  | Al(.15)Ga(.85)As | P+ | 3.5E18 | 30 | 155d |
|  | Al(.15)Ga(.85)As |  | UD | 80 | 155c |
|  | Al(.15)Ga(.85)As | N | 3.5E18 | 300 | 155b |
| 18 { | Al(.15)Ga(.85)As |  | UD | 80 | 155a |
| 16 { | Al(.7)Ga(.3)As | N | 1E17 | 700 | 154 |
| 14 { | GaAs | N+ | 3.5E18 | 2200 | 153 |
|  | AlAs |  | UD | 1701 | 151 |
| 12 { | GaAs } ×7 |  | UD | 696 | 152 |
|  | AlAs |  | UD | 1701 | 151 |
| 10 { | GaAs Substrate |  | SI |  | 149 |

FIG. 2A

| Layer Material | Layer Doping Type | Typical Doping Concentration (atoms/cm$^{-3}$) | Typical Layer Thickness (A) | Layer # | |
|---|---|---|---|---|---|
| InGaAs | p+ | 1E20 | 25 | 165b | } 30 |
| GaAs | p+ | 1E20 | 75 | 165a | |
| GaAs | p | 1-5E17 | 300 | 164 | } 28 |
| AlAs | p+ | 3.5E18 | >20, <300 | 168b | |
| GaAs | und | und | >6, <20 | 168a | } 26 |
| Al.15Ga.85As | und | und | 200 - 300 | 163c | |
| Al.15Ga.85As | n+ | 3.5E18 | 80 | 163b | |
| Al.15Ga.85As | und | und | 20-30 | 163a | |
| GaAs | und | und | 15 | 162 | } 24 |
| In.15Ga.85AsN ⎫ | und | und | 60 | 161 | |
| GaAs ⎭ x3 | und | und | 100 | 160b | |
| GaAs | und | und | 100 - 250 | 160a | |
| Al.15Ga.85As | und | und | 5000 | 159 | } 22 |
| AlAs | und | und | 10 | 167 | |
| GaAs | und | und | 100 | 158 | |
| In.15Ga.85AsN ⎱ x3 | und | und | 60 | 157 | } 20 |
| GaAs | und | und | 15 | 156 | |
| Al.15Ga.85As | und | und | 30 | 155d | |
| Al.15Ga.85As | P+ | 3.5E18 | 80 | 155c | |
| Al.15Ga.85As | und | und | 200-300 | 155b | } 18 |
| GaAs | und | und | >6, <20 | 166b | } 16 |
| AlAs | N+ | 3.5E18 | >30, <200 | 166a | |
| GaAs | N+ | 3.5E18 | 1000 - 2000 | 153 | } 14 |
| AlAs | und | und | 1701 | 151 | |
| GaAs ⎱ x7 | und | und | 696 | 152 | } 12 |
| AlAs ⎰ | und | und | 1701 | 151 | |
| GaAs Substrate | | SI | | 149 | } 10 |

FIG. 2D

OPTOELECTRONIC DEVICE EMPLOYING AT LEAST ONE SEMICONDUCTOR HETEROJUNCTION THYRISTOR FOR PRODUCING VARIABLE ELECTRICAL/OPTICAL DELAY

CROSS REFERENCE TO RELATED APPLICATIONS

The present application relates to co-pending U.S. patent application Ser. No. 09/798,316, filed Mar. 2, 2001, commonly assigned to assignee of the present invention, herein incorporated by reference in its entirety.

BACKGROUND OF THE INVENTION

1. Field of the Invention

This invention relates broadly to the field of optoelectronics devices, and, more particularly to mechanisms that provide temporal delay to an electrical pulse and/or optical pulse and systems employing such mechanisms. In addition, the invention relates broadly to the field of semiconductor heterojunction devices, and more particularly, to transistors, optical emitters, optical detectors, optical modulators, optical amplifiers and other optoelectronic devices utilizing semiconductor heterojunction devices.

2. State of the Art

Mechanisms that impart a temporal delay to an optical pulse and/or electrical pulse are important components in many diverse applications, including optical/electrical clock generators and other frequency synthesis applications, optical/electrical communication systems, signal processing systems, and phased array antenna systems.

In optical applications, temporal delay of an optical pulse (referred to below as an input optical pulse) is typically provided in the electrical domain by converting the optical signal to an electrical signal using a photodetector. The electrical output of the photodetector produces an electrical pulse corresponding to the input optical pulse. A delay is imparted on the electrical pulse with a microstrip or stripline delay line. The length of the delay line dictates the temporal delay imparted on the electrical pulse. The electrical signal produced by the delay line is then used to drive a laser diode (or other optical source) to produce an optical signal that includes an output optical pulse that is temporally delayed with respect to the input optical pulse.

Temporal delay of an optical pulse can also be provided in the optical domain utilizing an optical delay line wherein path length of the optical delay line dictates the temporal delay imparted on the input optical pulse. Variable temporal delay is typically implemented by varying optical path length of the optical signal passing through the optical delay line. Path length variation can be realized with a multitude of optical fibers and a switch (such as a micromechanical mirror (MEM) switch) that switches the optical signal to one of the fibers to set the optical delay. U.S. patent application Publication US2002/0067877 describes an exemplary optical delay line utilizing this approach. Alternatively, path length variation can be realized by supplying the optical signals to a resonant cavity. Switchable mirrors enable the signal to resonate within the cavity (to increase the optical delay time) and escape the cavity for output. U.S. Pat. No. 6,028,693 describes an exemplary optical delay line utilizing this approach. It has also been proposed to use a photonic band gap structure (a plurality of layers which exhibit a series of photonic bandgaps) to provide variable optical delay. U.S. Pat. Nos. 6,396,617 and 5,751,466 describe an exemplary optical delay line utilizing this approach. In U.S. Pat. No. 5,751,466, the amount of delay is varied by applying a predetermined voltage or set of voltages (or by varying the frequency of the applied signal) to the layers of the photonic band gap structure to vary the index of refraction thereof.

In high frequency electrical applications, including RF and microwave communication/signal processing systems, temporal delay of an electrical pulse is typically provided by a microstrip or stripline delay line. The length of the delay line dictates the temporal delay imparted on the electrical pulse.

Each of these prior art approaches is costly to design and manufacture because it is complex and difficult to integrate with other optoelectronic devices (such as optical emitters, optical detectors, optical modulators, optical amplifiers), electronic devices (such as FET transistors and bipolar transistors), and optical devices such as passive optical waveguides.

Thus, there is a great need in the art for an improved optical/electrical pulse delay mechanism that provides accurate and controllable temporal delay and that has lower cost and ease of integration with a broad range of devices such as optical emitters, optical detectors, optical modulators, optical amplifiers, transistors, and passive waveguides.

SUMMARY OF THE INVENTION

It is therefore an object of the invention to provide a mechanism that provides accurate and controllable optical/electrical pulse delay and that has lower cost and ease of integration with a broad range of devices such as optical emitters, optical detectors, optical modulators, optical amplifiers, transistors, and optical waveguides.

It is another object of the invention to provide an optical/electrical pulse delay mechanism that is formed from a multilayer growth structure that can also be used to build a broad range of devices such as optical emitters, optical detectors, optical modulators, optical amplifiers, transistors, and optical waveguide devices.

It is a further object of the invention to provide an optical/electrical pulse delay mechanism utilizing a thyristor device formed from a multilayer growth structure that can also be used to build a broad range of devices such as optical emitters, optical detectors, optical modulators, optical amplifiers, transistors, and optical waveguide devices.

It is an additional object of the invention to provide an optical/electrical pulse delay mechanism utilizing a device formed from a multilayer growth structure wherein the magnitude of the delay is controllable over a range of delay values, preferably in the range between 10 picoseconds and 1 microsecond.

It is also an object of the invention to provide a plurality of variable optical/electrical pulse delay mechanisms each utilizing a thyristor device formed from a multilayer growth structure to thereby optical/electrical delay (with respect to an input pulse) over a plurality of optical channels.

It will be appreciated that such variable optical/electrical pulse delay mechanisms utilizing thyristor devices formed from a multilayer growth structure can be used in many diverse applications such as phased array systems.

According to the present invention, an optoelectronic integrated circuit comprises a resonant cavity formed on a substrate. A heterojunction thyristor device is formed from a multi-layer structure in the resonant cavity. The heterojunction thyristor device detects an input optical pulse (or input electrical pulse) and produces an output optical pulse via laser emission in response to the detected input optical pulse (input electrical pulse) for output outside the resonant cavity. There is a time delay between the input optical pulse (or input electrical pulse) and the output optical pulse, the magnitude of which depends upon the operational characteristics of the device, including bias current supplied to the active quantum well channels therein, amplitude of the input optical pulse (or input electrical pulse) and other device characteristics.

The heterojunction thyristor device also produces an output electrical pulse synchronous to the output optical pulse. Thus, there is a time delay between the input optical pulse (or input electrical pulse) and the output electrical pulse. The magnitude of this delay depends upon the same operational characteristics of the device, including bias current supplied to the active quantum well channels therein, amplitude of the input optical pulse (or input electrical pulse) and other device characteristics.

According to one embodiment of the present invention, the heterojunction thyristor device includes a channel region operably coupled to a current source that draws constant bias current from active quantum well channel(s) of the device. An input optical pulse is injected into the resonant cavity which is resonantly absorbed in the active quantum well channel(s), which produces a charge in the active quantum well channel(s) sufficient to switch the device into a conducting/ON state. In the ON state, the device operates in lasing mode to produce light that forms the output optical pulse. After the input optical pulse terminates, the device switches into the OFF state because the bias current draws charge from the active quantum well channel(s). In the OFF state, laser emission ceases and the output optical pulse terminates. The heterojunction thyristor device also produces an output electrical pulse (at its cathode terminal) synchronous to the output optical pulse. The time delay between the input optical pulse and the output optical pulse (output electrical pulse) is controllably varied by modulating the amplitude of the input optical pulse.

Alternatively, instead of injecting an input optical pulse into the resonant cavity, an input electrical pulse can be injected into active quantum well channel(s) of the device. This input electrical pulse operates similar to the input optical pulse to produce charge in the active quantum well channel(s) sufficient to switch the device into the ON state. In the ON state, the device operates in lasing mode to produce light that forms the output optical pulse. After the input electrical pulse terminates, the device switches into the OFF state because the bias current draws charge from the active quantum well channel(s). In the OFF state, laser emission ceases and the output optical pulse terminates. In this configuration, the heterojunction thyristor device produces an output electrical pulse (at its cathode terminal) synchronous to the output optical pulse. The time delay between the input electrical pulse and the output optical pulse (output electrical pulse) is controllably varied by modulating the amplitude of the input electrical pulse.

According to a second embodiment of the present invention, the heterojunction thyristor device includes a channel region operably coupled to a current source that draws current from the channel region. An input optical pulse is injected into the resonant cavity which produces an output optical pulse (and synchronous output electrical pulse) as summarized above. In this second embodiment, time delay between the input optical pulse and the output optical pulse (and synchronous output electrical pulse) is controllably varied by regulating the amount of bias current drawn by the current source.

Alternatively, instead of injecting an input optical pulse into the resonant cavity, an input electrical pulse can be injected into active quantum well channel(s) of the device. This input electrical pulse operates similar to the input optical pulse to produce an output optical pulse (and synchronous output electrical pulse) as summarized above. In this second embodiment, time delay between the input electrical pulse and the output optical pulse (and synchronous output electrical pulse) is controllably varied by regulating the amount of bias current drawn by the current source.

According to other embodiments of the present invention, monolithic optoelectronic integrated circuits that include a heterojunction thyristor device formed from a multi-layer structure in the resonant cavity are integrated with other optoelectronic devices (such as optical emitters, optical detectors, optical modulators, optical amplifiers), electronic devices (such as transistors) in addition to optical devices (such as waveguide devices).

Additional objects and advantages of the invention will become apparent to those skilled in the art upon reference to the detailed description taken in conjunction with the provided figures.

BRIEF DESCRIPTION OF THE DRAWINGS

FIG. 1B1 is pictorial illustration of a heterojunction thyristor device in accordance with the present invention that is useful in explaining the configuration and operational characteristics of the device; in this configuration, an input optical pulse is part of the Optical IN signal that is resonantly absorbed by the device.

FIG. 1B2 is pictorial illustration of a heterojunction thyristor device in accordance with the present invention that is useful in explaining the configuration and operational characteristics of the device; in this configuration, an input electrical pulse is part of the electrical IN signal that is injected into the device via the injector terminal.

FIG. 2A is a cross-sectional schematic showing an exemplary layer structure made with group III-V material in accordance with the present invention, and from which devices of the present invention can be made.

FIG. 2D is a cross-sectional schematic showing an alternate layer structure made with group III-V material in accordance with the present invention, and from which devices of the present invention can be made.

DETAILED DESCRIPTION OF THE PREFERRED EMBODIMENTS

Figure 1A:
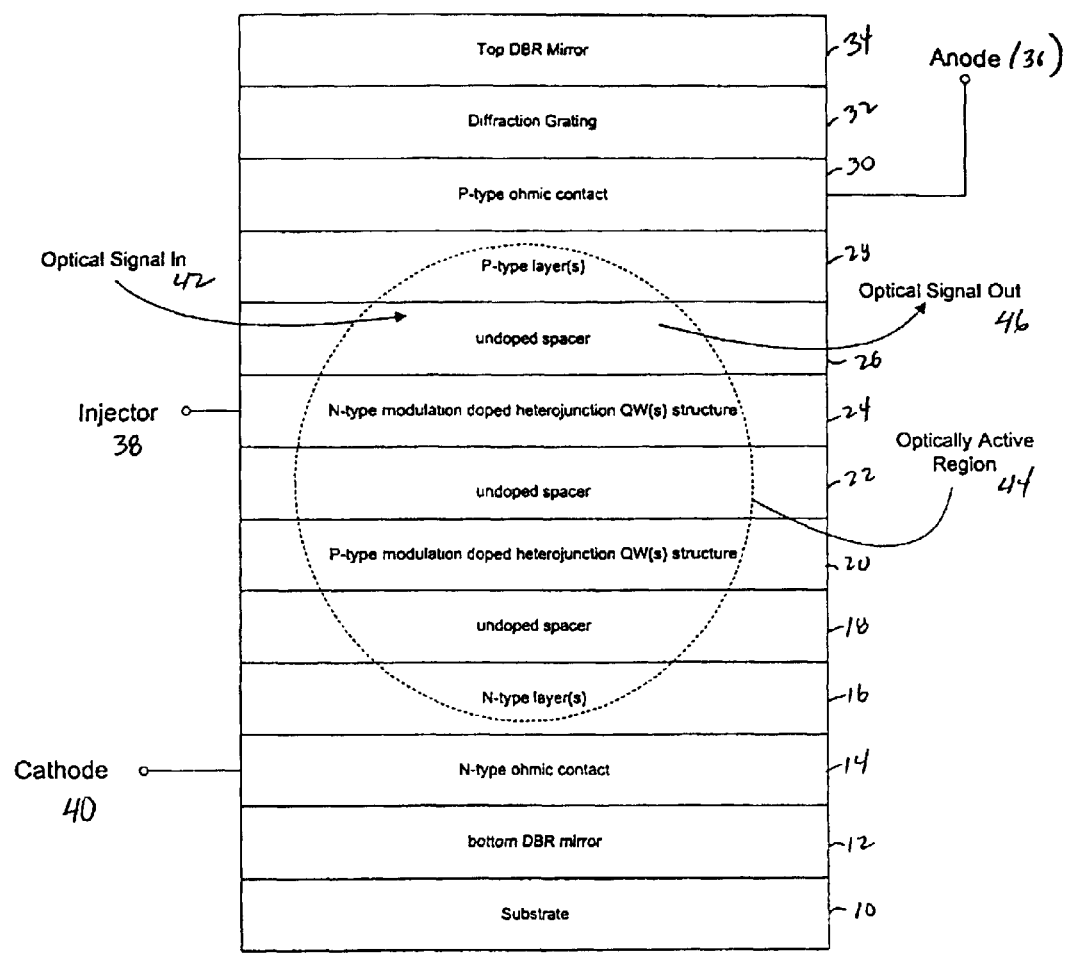
FIG. 1A is a cross-sectional schematic showing a layer structure in accordance with the present invention, and from which devices of the present invention can be made.

Modulation-doped quantum well heterojunction transistors—including well known Pseudomorphic Pulsed Doped High Electron Mobility Transistors (Pulsed Doped PHEMT), which are sometimes referred to as Pulsed Doped Modulation Doped Field Effect Transistors (Pulsed Doped MODFET) or Pulsed Doped Two Dimensional Gas Field Effect Transistors (Pulsed Doped TEGFET)—have become well recognized for their superior low noise and high frequency performance and are now in demand in many high frequency applications (e.g., front end amplifier in wireless communications systems and in Monolithic Microwave and Millimeterwave IC (MMIC) designs).

GaAs/InGaAs/AlxGa$_{1-x}$As is the III-V material system of choice for these devices because of the ability to grow high optical/electrical quality epitaxial layers by molecular beam epitaxy (MBE). Alternatively, strained silicon heterostructures employing silicon-germanium (SiGe) layers have been used to produce such devices.

U.S. Pat. No. 4,827,320 to Morkoc et al. discloses a pseudomorphic HEMT (PHEMT) structure that employs a layer of strained InGaAs (undoped) between a GaAs substrate and a layer of undoped AlGaAs to form a quantum well defined by the strained InGaAs layer. A layer of n+ doped AlGaAs is formed on the undoped AlGaAs layer. A layer of n+ GaAs is formed on the layer of n+ doped AlGaAs. The layer of n+ GaAs facilitates an ohmic contact to source/drain electrodes. A gate electrode of aluminum is recessed below the layer of n+ GaAs and a portion of the n+ AlGaAs layer by wet chemical etch and evaporation of aluminum.

The PHEMT structure has been very successful in producing microwave transistors that operate well into the multi-gigahertz regime, initially being used extensively in military systems and now finding their way into commercial products, particularly in the area of cellular communications. In recent years, there has been a growing interest in combining the PHEMT with optical capability because of the difficulty in propagating very high frequency signals to and from the integrated circuit by coaxial lines. Combining electronic with optoelectronic components monolithically gives rise to the concept of the optoelectronic integrated circuit (OEIC). However, there are serious problems encountered because of the dissimilar nature of the structures of the FET, the pn junction laser, PIN diode, etc.

To achieve this goal, inversion channel heterojunction structures created from a single epitaxial growth have been used to realize a range of optoelectronic devices including lasers, detectors and field effect transistors (FETs). An exemplary inversion channel heterojunction structure is described in Taylor and Kiely, "Theoretical and Experimental Results for the Inversion Channel Heterostructure Field Effect Transistors", IEE Proceedings-G, Vol. 140, No. 6, December 1993. In this structure, for the region between the modulation doping layer and the gate of the semiconductor surface, the doping of this region is substantially p type in order to provide a low resistance ohmic contact for the gate of the FET.

However, the high p-type doping of this region creates many problems, including:

i) the effects of free carrier absorption makes formation of a vertical cavity laser difficult;

ii) forming a depletion-type FETs by implanting n-type dopant is difficult; this difficulty stems from the difficulty in controlling the dopant density in the bulk region; more specifically, compensating a large p density with a large n density to obtain a lower p density is difficult to control in a bulk region (but much easier in a delta doped region);

iii) controlling the threshold voltage of an enhancement type FET is difficult because the input capacitance is a function of doping which is harder to control than layer thickness; and iv) producing effective current funneling for inducing lasing is difficult; more specifically, it is very desirable to create a pn junction by N type implantation to steer the current in this structure since this would be compatible with the overall approach to building the FET devices; the heavy p doping bulk layers makes it difficult to create junction isolation that has low leakage.

The present invention builds upon novel device structures utilizing modulation-doped quantum well heterojunctions that do not suffer from the problems associated with the prior art PHEMT devices. Such novel device structures are described in detail in U.S. Pat. No. 6,031,243; U.S. patent application Ser. No. 09/556,285 filed on Apr. 24, 2000; U.S. patent application Ser. No. 09/798,316 filed on Mar. 2, 2001; U.S. patent application Ser. No. 08/949,504 filed on Oct. 14, 1997, U.S. patent application Ser. No. 10/200,967 filed on Jul. 23, 2002; U.S. application Ser. No. 09/710,217 filed on Nov. 10, 2000; U.S. patent application Ser. No. 60/376,238 filed on Apr. 26, 2002; each of these references herein incorporated by reference in its entirety.

In accordance with the present invention, a heterojunction thyristor device is configured to operate as an optical detector that detects an input optical pulse and as a vertical cavity laser that produces an output optical pulse in response to the detected input optical pulse. A variable time delay between the input optical pulse and output optical pulse (and the output electrical pulse) is controlled by modulating the optical power of the input beam or by varying a bias current supplied to the injector control terminal (which is analogous to the gate terminal of conventional thyristor devices). The general structure of the heterojunction thyristor device is illustrated in the cross-section of FIG. 1A. In addition, the general structure of FIG. 1A can be configured to operate as an optical modulator that modulates the optical signal passing through the device, as a field effect transistor, and as a passive waveguide as described herein in detail such that these devices can be integrated to form a monolithic optoelectronic integrated circuit as described herein.

Turning now to FIG. 1A, the heterojunction thyristor device 1 of the present invention includes bottom dielectric distributed bragg reflector (DBR) mirror 12 formed on substrate 10. The bottom DBR mirror 12 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$. Deposited upon the bottom DBR mirror 12 is the active device structure which consists of two HFET devices. The first of these is a p-channel HFET 11 (comprising layers 14,16,18,20 and 22) which has one or more p-type modulation doped quantum wells and is positioned with the gate terminal on the lower side (i.e. on the mirror as just described) and the collector terminal on the upper side. The second of these is an n-channel HFET 13 (comprising layers 22,24,26,28,30) which has one or more n-type modulation doped quantum wells and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type ohmic contact layer(s) 14 which enables the formation of ohmic contacts thereto. As shown, ohmic contact layer 14 is operably coupled to cathode terminal 40 of the heterojunction thyristor device (which corresponds to the gate electrode of the p-channel HFET device 11). Deposited on layer 14 is one or more n-type layers 16 and an undoped spacer layer 18 which serve electrically as part of the P-channel HFET gate and optically as a part of the lower waveguide cladding of the device. Deposited on layer 18 is a p-type modulation doped heterojunction structure 20 that defines one or more quantum wells (which may be formed from strained or unstrained heterojunction materials). Deposited on p-type modulation doped heterojunction structure 20 is an undoped spacer layer 22, which forms the collector of the P-channel HFET device. All of the layers grown thus far form the P-channel HFET device with the gate ohmic contact on the bottom.

Undoped spacer layer 22 also forms the collector region of the N-channel HFET device. Deposited on layer 22 is a n-type modulation doped heterojunction structure 24 that defines one or more quantum wells (which may be formed from strained or unstrained heterojunction materials). Deposited on the n-type modulation doped heterojunction structure 24 is an undoped spacer layer 26 and one or more p-type layers 28 which serve electrically as part of the n-channel HFET gate and optically as part of the upper waveguide cladding of the device. Preferably, the p-type layers 28 include two sheets of planar doping of highly doped p-material separated by a lightly doped layer of p-material. These p-type layers are separated from the N-type modulation doped quantum well (QW) heterostructure 24 by undoped spacer material 26. In this configuration, the top charge sheet achieves low gate contact resistance and the bottom charge sheet defines the capacitance of the n-channel HFET with respect to the N-type modulation doped QW heterostructure 24. Deposited on p-type layer(s) 28 is a p-type ohmic contact layer(s) 30 which enables the formation of ohmic contacts thereto. As shown, ohmic contact layer(s) 30 is operably coupled to the anode terminal 36 of the heterojunction thyristor device (which corresponds to the gate electrode of the n-channel HFET device).

Alternatively, the active device structure may be described as a pair of stacked quantum-well-base bipolar transistors formed on the bottom DBR mirror 12. The first of these is an n-type quantum-well-base bipolar transistor (comprising layers 14,16,18,20 and 22) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 22,24,26,28,30)

which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminal 40 of the heterojunction thyristor device corresponds to the emitter electrode of the p-type quantum-well-base bipolar transistor, the p-type QW structure 20 corresponds to the base region of the p-type quantum-well-base bipolar transistor, spacer layer 22 corresponds to the collector region of both the p-type quantum-well-base bipolar transistor and the n-type quantum-well-base bipolar transistor, the n-type QW structure 24 corresponds to the base region of the n-type quantum-well-base bipolar transistor, and the anode terminal 36 of the heterojunction thyristor device corresponds to the emitter electrode of the n-type quantum-well-base bipolar transistor.

The injector terminal 38 of the heterojunction thyristor device (which is analogous to the gate terminal of conventional thyristor devices) preferably is operably coupled to the QW channel(s) realized in the N-type modulation doped QW(s) heterostructure 24 as shown. Alternatively, the injector terminal of the heterojunction thyristor device may be operably coupled to the QW channel(s) realized in the P-type modulation doped QW(s) heterostructure 20. In such a configuration, the polarity of the control signals and direction of bias current applied to the injector terminal 38 as described below for operation of the heterojunction thyristor for detection/emission are reversed.

Alternately, a first injector terminal may be operably coupled to the QW channel(s) realized in the N-type modulation doped QW(s) heterostructure 24 while a second injector terminal is operably coupled to the P-type modulation doped QW(s) heterostructure 20. In such a configuration, the polarity of the control signals and direction of bias current applied to the second injector terminal as described below for operation of the heterojunction thyristor for detection/emission are reversed.

To form a resonant cavity device where light is input into and emitted from the device laterally (i.e., from a direction normal to the cross section of FIG. 1A), a diffraction grating 32 and top DBR mirror 34 is formed over the active device structure described above. When the heterojunction thyristor device is operating in the lasing mode, the diffraction grating 32 performs the function of diffracting light produced by the vertical cavity into light propagating laterally in a waveguide which has the top DBR mirror 34 and bottom DBR mirror 12 as waveguide cladding layers and which has lateral confinement regions (typically formed by implants as described herein in more detail). When the heterojunction thyristor device is operating in the optical detection mode, the diffraction grating 32 performs the function of diffracting incident light that is propagating in the lateral direction into the vertical cavity mode, where it is absorbed resonantly in the vertical cavity.

Alternatively, light may enter and exit the resonant vertical cavity through an optical aperture (not shown) in the top surface of the device. In this case, the diffraction grating 32 is omitted, the top DBR mirror 34 defines a cavity for the vertical emission and absorption of light, and the device operates as a vertical cavity surface emitting laser/detector.

In either configuration, an optically active region 44 that encompasses the QW channel(s) of structures 24 and 20 is defined. When the heterojunction thyristor device is operating in the lasing mode, light is generated in the optically active region 44 of the vertical cavity where it resonates for output therefrom to produce the optical signal OUT 46 (which propagates in the vertical dimension or in the lateral dimension with the use of diffraction grating 32 as described above).

When the heterojunction thyristor device is operating in the optical detection mode, the optical signal IN 42 (which propagates in the vertical direction, or which propagates in the lateral direction and is diffracted from the lateral direction into a vertical propagation direction by diffraction grating 32) is resonantly absorbed in region 44, which induces a change in the current flowing through the device.

The heterojunction thyristor device can also operate in electrical detection mode wherein an electrical input pulse signal is injected into the QW channel(s) of structure 24 (and/or the QW channel(s) of structure 20) via the injector terminal 38 of the device to induce a change in the current flowing through the device.

The distance between the top DBR mirror 34 and bottom DBR mirror 12 preferably represents an integral number of ¼ wavelengths at the designated wavelength. This distance is controlled by adjusting the thickness of one or more of the layers therebetween to enable this condition.

FIGS. 1B1, 1B2 and 1C illustrate the operational characteristics of the heterojunction thyristor device of the present invention over varying injector currents $I_g$. The device switches from a non-conducting/OFF state (where the current I is substantially zero) to a conducting/ON state (where current I is substantially greater than zero) when: i) the anode terminal is forward biased (e.g. biased positively) with respect to the cathode terminal; and ii) the voltage between injector electrode and anode electrode is forward biased for a period long enough to produce a charge in the N-type modulation doped QW heterostructure 24 that is greater than the critical switching charge $Q_{CR}$, which is that charge that reduces the forward breakdown voltage such that no off state bias point exists. The critical switching charge $Q_{CR}$ is unique to the geometries and doping levels of the device. The forward breakdown voltage of the device varies over the injector current $I_g$ as shown.

The device switches from the conducting/ON state (where the current I is substantially greater than zero) to a non-conducting/OFF state (where current I is substantially zero) when the current I through device falls below the hold current $I_H$ of the device for a sufficient period of time such that the charge in the N-type modulation doped QW heterostructure 24 decreases below the holding charge $Q_H$, which is the critical value of the channel charge which will sustain holding action.

As an optoelectronic component, the heterojunction thyristor device is multifunctional. If the anode terminal 36 is forward biased (e.g. biased positively) with respect to the cathode terminal 40 and the injector terminal 38 is forward biased with respect to the anode terminal 36 for a period long enough to produce the critical switching charge $Q_{CR}$ in the N-type modulation doped QW heterostructure 24, then the heterojunction thyristor will switch to its conducting/ON state. If the current I in the conducting/ON state is above the threshold for lasing, then laser emission will occur. This is the operation of a semiconductor laser. If the heterojunction thyristor is in the non-conducting/OFF state and light is admitted into the cavity, then the device functions as an optical detector in the sense that when sufficient electron-hole pairs have been generated to produce the critical switching charge $Q_{CR}$ in the N-type modulation doped QW heterostructure 24, the heterojunction thyristor will switch to its ON state.

Figure 1C:
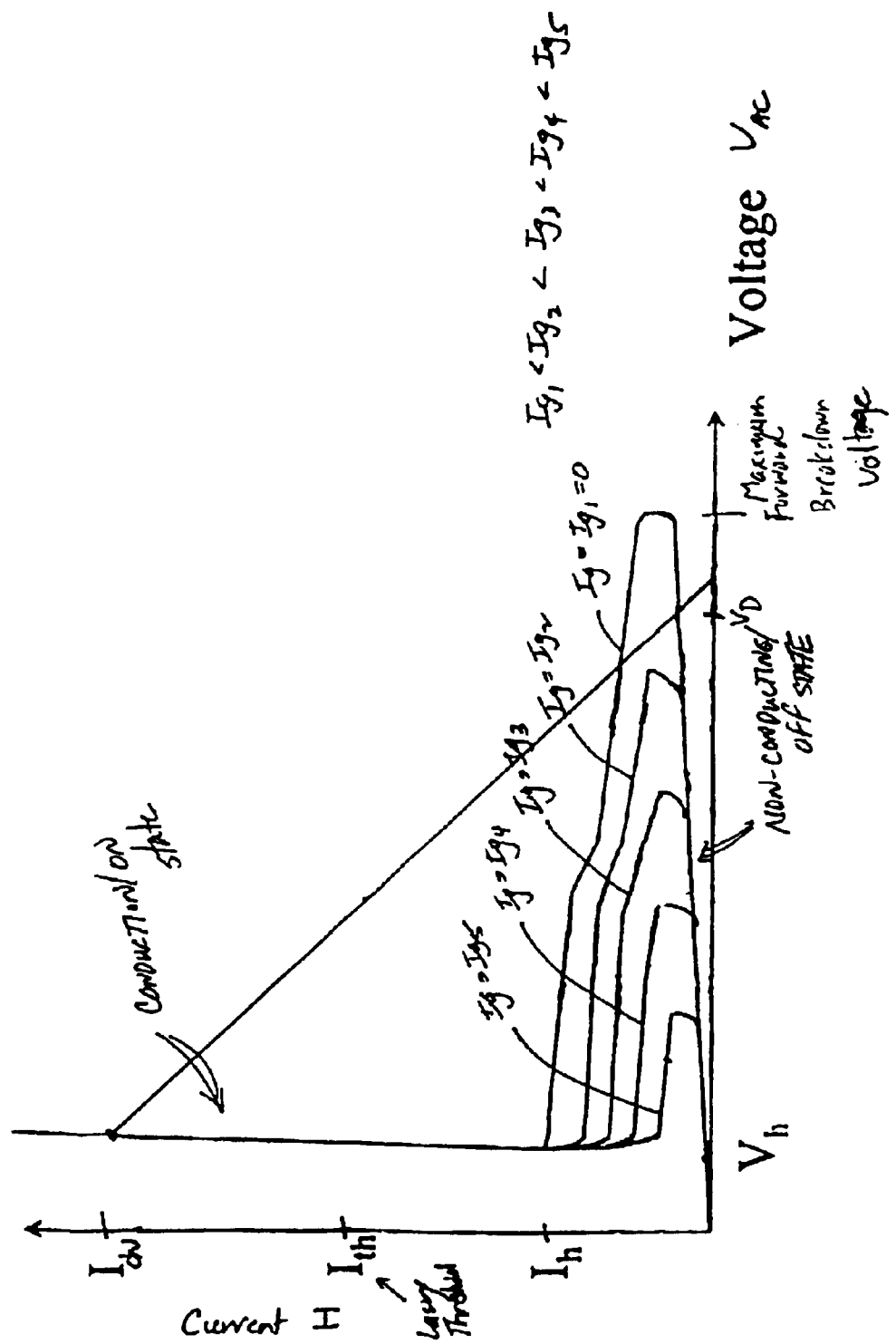
FIG. 1C is a graph showing the current-voltage characteristics of the heterojunction thyristor devices of the present invention over varying injector currents ($I_g$), and the bias line that depicts operation of the heterojunction thyristor device as a detector/modulator that detects an input optical pulse (or input electrical pulse) and produces an output optical pulse via laser emission in response to the detected input pulse. An output electrical pulse that is synchronous to the output optical pulse is also produced after the time delay.
Figure 1D:
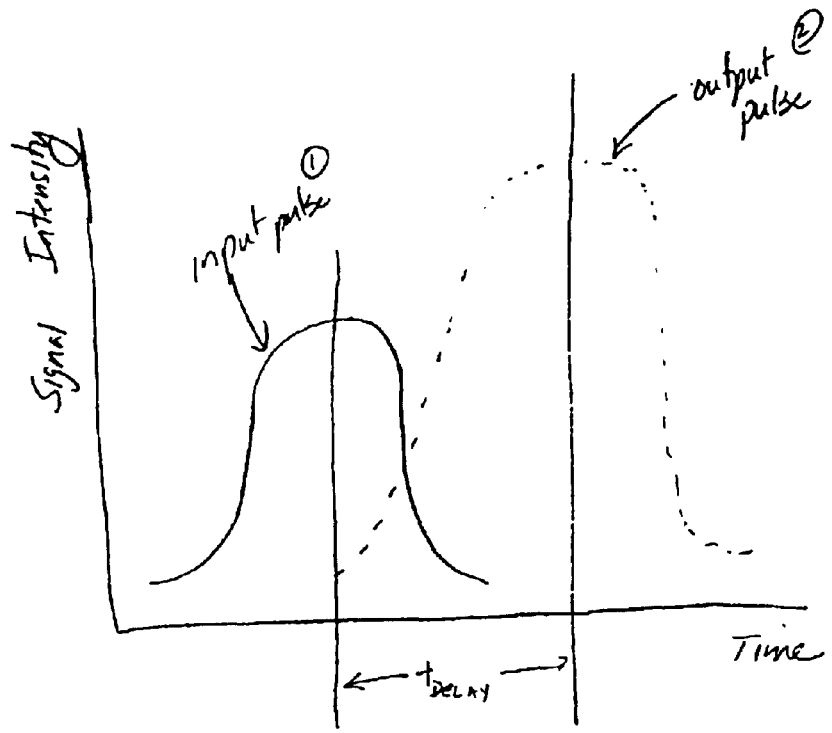
FIG. 1D is a graph depicting an exemplary time delay between the input optical pulse (or input electrical pulse) and the output optical pulse produced by the heterojunction thyristor devices of the present invention. An output electrical pulse that corresponds to the output optical pulse is also produced at the cathode terminal of the device after the time delay shown.

As shown in FIG. 1B1, the heterojunction thyristor device can be configured to operate as an optical detector that detects an input optical pulse and as a vertical cavity laser that produces a corresponding output optical pulse (in response to a detected input optical pulse). This configuration is referred to herein as a optical detector/emitter and is achieved by applying a forward bias between the anode and cathode terminals that is less than the maximum forward breakdown voltage of the device as shown in FIG. 1C. This may be accomplished, for example, by coupling the anode terminal to a positive supply voltage $V_D$ and the cathode terminal 40 to ground through load resistance as shown in FIG. 1B1. In addition, the injector terminal 38 is forward biased with respect to the anode terminal 36 through a current source that generates a bias current $I_{BIAS}$ as shown in FIG. 1B1.

When an input optical pulse is incident on the heterojunction thyristor, in the event that the incident light has sufficient intensity to produce photocurrent in excess of the bias current $I_{BIAS}$ drawing on the injector terminal 38 and such photocurrent produces the critical switching charge $Q_{CR}$ in the N-type modulation doped QW heterostructure 24, the heterojunction thyristor will switch to its conducting/ON state. In the ON state, the current I through the device is above the threshold for lasing and laser emission occurs to produce light that resonates in the cavity to form the output optical pulse at a delay time $t_{delay}$.

When the incident light is reduced, the thyristor will switch to the OFF state because the bias current $I_{BIAS}$ provided by the current source to the injector terminal 38 drains the channel of charge, which causes the channel charge to fall below the holding charge $Q_H$. In the OFF state, the current I through the device is below the threshold for lasing and the laser emission ceases.

In this manner, the heterojunction thyristor device operates as an optical detector that detects an input optical pulse and as a vertical cavity laser that produces a corresponding output optical pulse (and corresponding output electrical pulse) at a delay time $t_{delay}$ in response to a detected input optical pulse. This operation is illustrated pictorially in FIG. 1D. An output electrical pulse (not shown) that corresponds to the output optical pulse is also produced after the time delay shown.

As shown in FIG. 1B2, the heterojunction thyristor device can be configured to operate as an electrical detector that detects an input electrical pulse and as a vertical cavity laser that produces a corresponding output optical pulse (in response to a detected input electrical pulse). This configuration is referred to herein as a electrical detector/emitter and is achieved by applying a forward bias between the anode and cathode terminals that is less than the maximum forward breakdown voltage of the device as shown in FIG. 1C. This may be accomplished, for example, by coupling the anode terminal to a positive supply voltage $V_D$ and the cathode terminal 40 to ground through load resistance as shown in FIG. 1B2. In addition, the injector terminal 38 is forward biased with respect to the anode terminal 36 through a current source that generates a bias current $I_{BIAS}$ as shown in FIG. 1B2.

When an input electrical pulse is injected into the N-type modulation doped QW heterostructure 24 via the injector terminal 38, in the event that the incident electrical energy has sufficient intensity to produce current in excess of the bias current $I_{BIAS}$ drawing on the injector terminal 38 and such current produces the critical switching charge $Q_{CR}$ in the N-type modulation doped QW heterostructure 24, the heterojunction thyristor will switch to its conducting/ON state. In the ON state, the current I through the device is above the threshold for lasing and laser emission occurs to produce light that resonates in the cavity to form the output optical pulse at a delay time $t_{delay}$.

When the input electrical pulse terminates, the thyristor will switch to the OFF state because the bias current $I_{BIAS}$ provided by the current source to the injector terminal 38 drains the channel of charge, which causes the channel charge to fall below the holding charge $Q_H$. In the OFF state, the current I through the device is below the threshold for lasing and the laser emission ceases.

In this manner, the heterojunction thyristor device operates as an electrical detector that detects an input electrical pulse and as a vertical cavity laser that produces a corresponding output optical pulse (and corresponding output electrical pulse) at a delay time $t_{delay}$ in response to a detected input optical pulse. This operation is illustrated pictorially in FIG. 1D. An output electrical pulse (not shown) that corresponds to the output optical pulse is also produced after the time delay shown.

In addition, the heterojunction thyristor device of the present invention can be configured to operate as various other optoelectronic components including a PIN detector, digital optical modulator, analog optical modular, and optical amplifier as described below.

A PIN detector generates an electrical signal proportional to the optical signal incident thereon. To configure the heterojunction thyristor device as a PIN detector, the cathode terminal 40 floats electrically and a reverse bias is applied between the injector terminal 38 and the anode terminal 36. Such a configuration creates a reverse-bias PIN junction that generates an electrical signal (photocurrent) proportional to the optical signal incident to the vertical cavity.

A digital optical modulator operates in one of two distinct optical states in modulating an input optical signal. In optical state 1, there is no loss to input optical signal via absorption. In optical state 2, all of the input optical signal is absorbed. To configure the heterojunction thyristor device as a digital optical modulator, an optical path is provided through the device either vertically or in the waveguide mode, and an input signal is applied to the injector terminal 38 with respect to the anode terminal 36.

When the input signal produces a forward bias between the injector terminal 38 and the anode terminal 36 sufficient to produce charge in the N-type modulation doped QW heterostructure 24 greater than critical switching charge $Q_{CR}$, the heterojunction thyristor operates in its conducting/ON state. The device is biased such the current I through the device in the ON state is substantially below threshold for lasing (preferably about one-third of the lasing threshold current). In this configuration, in the ON state, the device operates in optical state 1 whereby there is no loss to input optical signal via absorption.

When the input signal produces a reverse bias between the injector terminal 38 and the anode terminal 36 which draws current from the anode terminal 36 sufficient to decrease the charge in the N-type modulation doped QW heterostructure 24 below the hold charge $Q_H$, the heterojunction thyristor operates in its non-conducting/OFF state. In the OFF state, the device operates in optical state 2 whereby all of the input optical signal is absorbed.

An analog optical modulator modulates an input optical signal linearly over a range of modulation values. To configure the heterojunction thyristor device structure as an analog optical modulator, the cathode terminal 40 floats electrically and the thyristor function is deactivated. An optical path is provided through the device either vertically or in the waveguide mode, and an input signal is applied to the anode terminal 36 with respect to the injector terminal(s) 38 such that the anode terminal 36 is biased positively with respect to the injector terminal(s) 38. In this configuration, the voltage at the anode terminal 36 is varied over a range of voltage levels where absorption of the device varies linearly. The top of the voltage range (where minimum absorption occurs) is defined by the operation point where conduction occurs from the anode terminal 36 to the injector terminals 38.

An optical amplifier amplifies an input optical signal to produce a corresponding output optical signal with an increased intensity level. To configure the heterojunction thyristor device as an optical amplifier, a forward bias is applied between the gate and cathode terminals, and a forward bias is applied between the anode and cathode terminals through a load resistance that sets the current I in the ON state at a point substantially below lasing threshold $I_{TH}$. In this configuration, in the ON state, the device amplifies an input optical signal to produce a corresponding output optical signal with an increased intensity level. The optical amplifier may be switched into and out of the ON state by applying forward and reverse biases to the injector terminal 38 with respect to the anode terminal 36 as described above. The gain of the optical amplifier in the ON state and thus the output signal intensity level may be changed by adjusting the current I in the ON state.

The structure of FIG. 1A may also be used to produce various transistor devices, including n-channel HFET devices, p-channel HFET devices, n-type quantum-well-base bipolar transistors and p-type quantum-well-base bipolar transistors.

In a n-channel HFET, ohmic metal source and drain electrodes are electrically coupled to spaced apart N-type implants, which are electrically coupled to the n-type QW structure 24 to form a channel region there between. An ohmic metal gate electrode is formed on the p-type ohmic contact layer 30 and covers the channel region. An ohmic metal collector electrode is electrically coupled to at least one P-type implant, which is electrically coupled to the p-type QW structure 20 below the channel region.

In a p-channel HFET, ohmic metal source and drain electrodes are electrically coupled to spaced apart p-type implants, which are electrically coupled to the p-type QW structure 20 to form a channel region there between. Outside the channel region, an ohmic metal gate electrode is deposited on the n-type ohmic contact layer 14. An n-type implant is deposited above collector layer 22. An ohmic metal collector electrode is formed on the n-type implant.

In a p-type quantum-well-base bipolar transistor, one or more base electrodes are electrically coupled to spaced apart P-type implants, which are electrically coupled to the p-type QW structure 20. Outside the p-type implants, one or more emitter electrodes are deposited on the n-type ohmic contact layer 14. A collector electrode is electrically coupled to an n-type implant, which is electrically coupled to the n-type QW structure 24. An additional collector electrode may be electrically coupled to another n-type implant into the p-type material of layer 28 or into the undoped spacer 26.

In an n-type quantum-well-base bipolar transistor, one or more base electrodes are electrically coupled to spaced apart n-type implants, which are electrically coupled to the n-type QW structure 24. One or more collector electrodes are electrically coupled to corresponding p-type implants, which are electrically coupled to the p-type QW structure 20. An emitter electrode is deposited on the n-type ohmic contact layer 30.

In addition, the structure of FIG. 1A may be used to produce an in-plane passive waveguide. In such a configuration, the diffraction grating, the ohmic gate/emitter electrode layers, and any contacts to n+ and p+ regions are omitted in order to minimize waveguide loss. The waveguide ridge cross-section is formed by a combination of several mesas, which are formed by vertical/horizontal surfaces formed in the layers between the top DBR mirror 34 and the bottom DBR mirror 12, to provide both laterally guiding and vertical guiding of light therein.

The heterojunction thyristor described above may be realized with a material system based on III-V materials (such as a GaAs/AlxGa$_{1-x}$As). FIG. 2A illustrates an exemplary epitaxial growth structure utilizing group III-V materials for realizing a heterojunction thyristor and associated optoelectrical/optical devices in accordance with the present invention. Alternatively, strained silicon heterostructures employing silicon-germanium (SiGe) layers may be used to realize the heterojunction thyristor devices and associated optoelectrical/optical devices described herein.

The structure of FIG. 2A can be made, for example, using known molecular beam epitaxy (MBE) techniques. A first semiconductor layer 151 of AlAs and a second semiconductor layer 152 of GaAs are alternately deposited (with preferably at least seven pairs) upon a semi-insulating gallium arsenide substrate 149 in sequence to form the top dielectric distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the above-described p-channel HFET (PHFET) 11, which has a p-type modulation doped quantum well and is positioned with the gate terminal on the bottom (i.e. on the mirror 12 just described) and the collector terminal above. The second of these is an n-channel HFET (NHFET) 13, which has an n-type modulation doped quantum well and is positioned with the gate terminal on top and the collector terminal below. The collector region of the NHFET device 13 also functions as the collector region of the PHFET device 11. However, the collector terminal of the NHFET device 13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active device layer structure begins with layer 153 of heavily N+ doped GaAs of about 2000 Å thickness to enable the formation of ohmic contacts to the gate electrode of the p-channel device. The N+ doped GaAs layer 153 corresponds to the ohmic contact layer 14 of FIG. 1A. Deposited on layer 153 is layer 154 of n-type $Al_{x1}Ga_{1-x1}As$ with a typical thickness of 500–3000 Å and a typical doping of $5\times10^{17}$ cm$^{-3}$. The parameter x1 is in the range between 15% and 80%, and preferably in the range of 30%–40% for layer 154. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are 4 layers (155a, 155b, 155c, and 155d) of $Al_{x2}1Ga_{1-x2}As$. These 4 layers (collectively, 155) have a total thickness about 380–500 Å and where x2 is about 15%. The first layer 155a is about 60–80 Å thick and is doped N+ type in the form of delta doping. The second layer 155b is about 200–300 Å thick and is undoped. The third layer 155c is about 80 Å thick and is doped P+ type in the form of delta doping. And the fourth layer 155d is about 20–30 Å thick and is undoped to form a spacer layer. This layer forms the lower separate confinement heterostructure (SCH) layer for the laser, amplifier and modulator devices. The n-type AlGaAs layer 154 and n-type AlGaAs layer 155a correspond to the n-type layer(s) 16 of FIG. 1A, and the undoped AlGaAs layer 155b corresponds to the undoped spacer layer 18 of FIG. 1A.

The next layers define the quantum well(s) that form the inversion channel(s) during operation of the PHFET 11. For a strained quantum well, this consists of a spacer layer 156 of undoped GaAs that is about 10–25 Å thick and then combinations of a quantum well layer 157 that is about 40–80 Å thick and a barrier layer 158 of undoped GaAs. The quantum well layer 157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 μm, the nitrogen content will be 0%; for a natural emission frequency of 1.3 μm, the nitrogen content will be approximately 2%; and for a natural emission frequency of 1.5 μm, the nitrogen content will be approximately 4–5%. The well barrier combination will typically be repeated (for example, three times as shown), however single quantum well structures may also be used. Unstrained quantum wells are also possible. Following the last barrier of undoped GaAs is a layer 159 of undoped $Al_{x2}1Ga_{1-x2}$ which forms the collector of the PHFET device 11 and is about 0.5 μm in thickness. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 1A. Undoped AlGaAs layer 159 corresponds to the undoped spacer layer 22 of FIG. 1A.

Layer 159 also forms the collector region of the NHFET device 13. Deposited on layer 159 are two layers (collectively 160) of undoped GaAs of about 200–250 Å total thickness, which form the barrier of the first n-type quantum well. Layer 160 is thicker than the normal barrier layer of about 100 Å because it accommodates the growth interruption to change the growth temperature from 610° C. (as required for optical quality $Al_{x2}1Ga_{1-x2}As$ layers) to about 530° C. for the growth of InGaAs. Therefore layer 160 includes a single layer 160a of about 150 Å and a repeating barrier layer 160b of about 100 Å. The next layer 161 is the quantum well of $In_{0.2}Ga_{0.8}As$, which is undoped and about 40–80 Å in thickness. It is noted that the n-type quantum well layer 161 need not be of the same formulation as the p-type quantum well layer 157. The barrier layer 160b of 100 Å and quantum well layer 161 may be repeated, e.g., three times. Then there is a barrier layer 162 of about 10–30 Å of undoped GaAs which accommodates a growth interruption and a change of growth temperature. Next there are four layers (collectively 163) of $Al_{x2}1Ga_{1-x2}As$ of about 300–500 Å total thickness. These four layers (163) include a spacer layer 163a of undoped $Al_{x2}1Ga_{1-x2}As$ that is about 20–30 Å thick, a modulation doped layer 163b of N+ type doping of $Al_{x2}1Ga_{1-x2}As$ (with doping about $3.5\times10^{18}$ cm$^{-3}$) that is about 80 Å thick, a capacitor spacing layer 163c of undoped $Al_{x2}1Ga_{1-x2}As$ that is about 200–300 Å thick, and a P+ type delta doped layer 163d of $Al_{x2}1Ga_{1-x2}As$ (with doping about $3.5\times10^{18}$ cm$^{-3}$) that is about 60–80 Å to form the top plate of the capacitor. The doping species for layer 163d is preferably carbon (C) to ensure diffusive stability. In contrast to layer 163b which is always depleted, layer 163d should never be totally depleted in operation. Layers 163d and 163b form the two plates of a parallel plate capacitor which forms the field-effect input to all active devices. For the optoelectronic device operation, layer 163 is the upper SCH region. Layer 163 must be thin to enable very high frequency operation. In the illustrated embodiment, for a transistor cutoff frequency of 40 GHz, a thickness of 300 Å would be used, and for 90 GHz a thickness of 200 Å would be more appropriate. The layers between the undoped GaAs barrier layer 160a and the N+ AlGaAs layer 163b correspond to the n-type modulation doped heterojunction QW structure 24 of FIG. 1A. Undoped AlGaAs layer 163c corresponds to the undoped spacer layer 26 of FIG. 1A.

One or more layers (collectively 164) of p-type $Al_{x1}Ga_{1-x1}As$ are deposited next to form part of the upper waveguide cladding for the laser, amplifier and modulator devices. Note that a majority of the upper waveguide cladding for waves propagating in the guide formed by the optically active region of the device is provided by the upper DBR mirror itself. The upper DBR mirror causes the light to be guided partially as a dielectric waveguide and partially as a mirror waveguide. Layer 164 has a typical thickness of 500–1500 Å. Layer 164 may have a first thin sublayer 164a of, e.g., 10–20 Å thickness and having a P+ typical doping of $10^{19}$ cm$^{-3}$. A second sublayer 164b has a P doping of $1\times10^{17}$–$5\times10^{17}$ cm$^{-3}$ and a typical thickness of 700 Å. The parameter X1 of layer 164 is preferably about 70%. The p-type layers 163b, 164A, 164B correspond to the p-type layer(s) 28 of FIG. 1A.

Deposited next is an ohmic contact layer 165 (which may comprise a single layer of GaAs or a combination of GaAs (165a) and InGaAs (165b) as shown), which is about 50–100 Å thick and doped to a very high level of P+ type doping (about $1\times10^{20}$ cm$^{-3}$) to enable the best possible ohmic contact.

Alternatively, the active device structure may be described as a pair of stacked quantum-well-base bipolar transistors formed on the bottom DBR mirror (layers 151/152). The first of these is an n-type quantum-well-base bipolar transistor (comprising layers 153 through 159) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 159 through 165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminal 40 of the heterojunction thyristor device corresponds to the emitter electrode of the p-type quantum-well-base bipolar transistor, the p-type QW structure (layers 155c though 158) corresponds to the base region of the p-type quantum-well-base bipolar transistor, spacer layer 159 corresponds to the collector region of both the p-type quantum-well-base bipolar transistor and the n-type quantum-well-base bipolar transistor, the n-type QW structure (layers 160a through 163b) corresponds to the base region of the n-type quantum-well-base bipolar transistor, and the anode terminal 36 of the heterojunction thyristor device corresponds to the emitter electrode of the n-type quantum-well-base bipolar transistor.

Figure 2B:
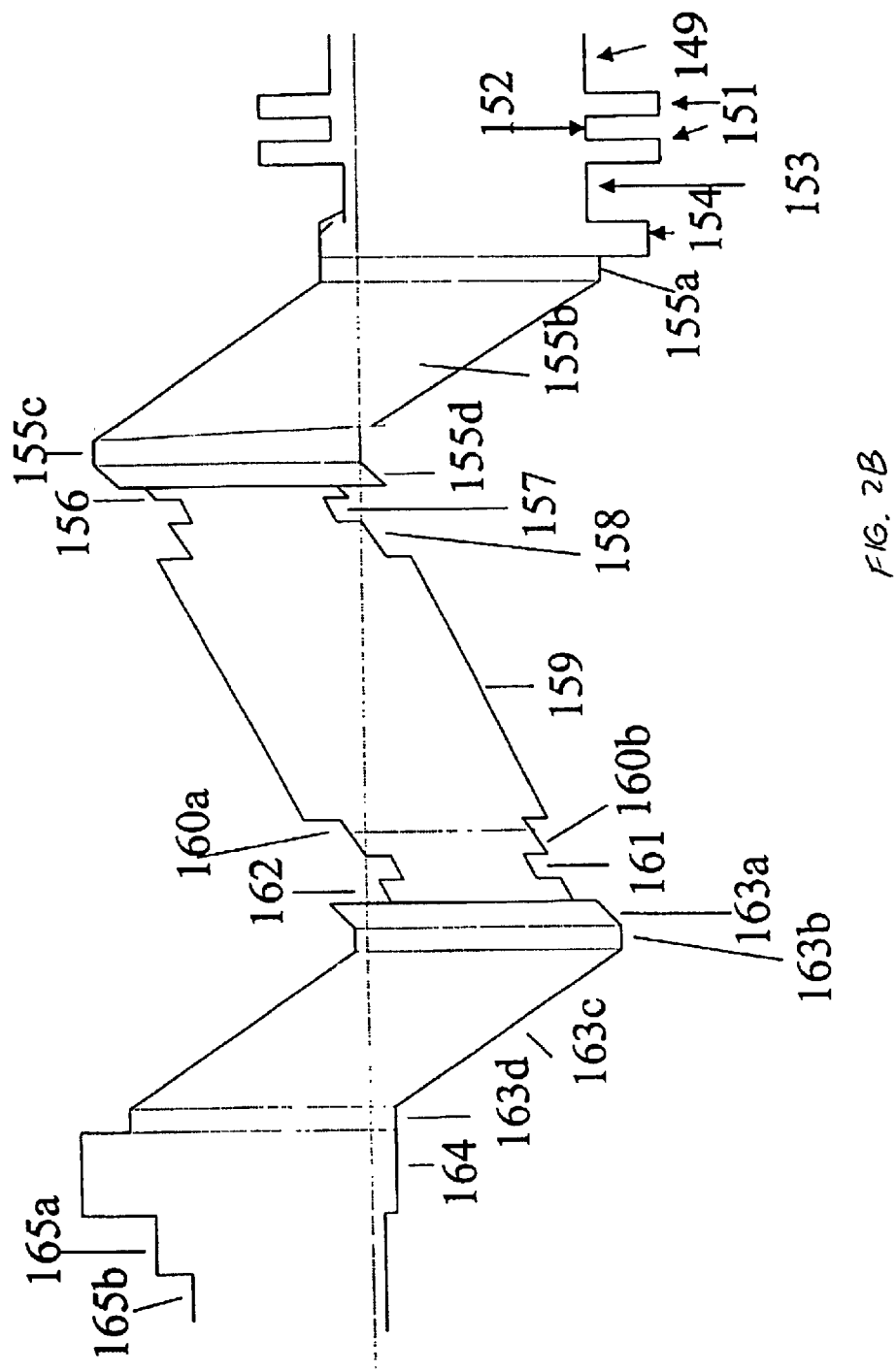
FIG. 2B shows the energy band diagram of the structure of FIG. 2A.

The band diagram of the FIG. 2A structure is shown in FIG. 2B.

To form a resonant cavity device where light is input into and emitted from the device laterally (i.e., from a direction normal to the cross section of FIG. 2A), a diffraction grating and top DBR mirror is formed over the active device structure described above. When the heterojunction thyristor device is operating in the lasing mode, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). When the heterojunction thyristor device is operating in the optical detection mode, the diffraction grating performs the function of diffracting incident light that is propagating in the lateral direction into the vertical cavity mode, where it is absorbed resonantly in the vertical cavity.

Alternatively, light may enter and exit the resonant vertical cavity vertically through an optical aperture in the top surface of the device. In this case, the diffraction grating is omitted, the top DBR mirror defines a cavity for the vertical emission and absorption of light, and the device operates as a vertical cavity surface emitting laser/detector. The distance between the top DBR mirror and bottom DBR mirror preferably represents an integral number of ¼ wavelengths at the designated wavelength. Preferably, the thickness of layer 164 or 159 is adjusted to enable this condition.

Figure 2C:
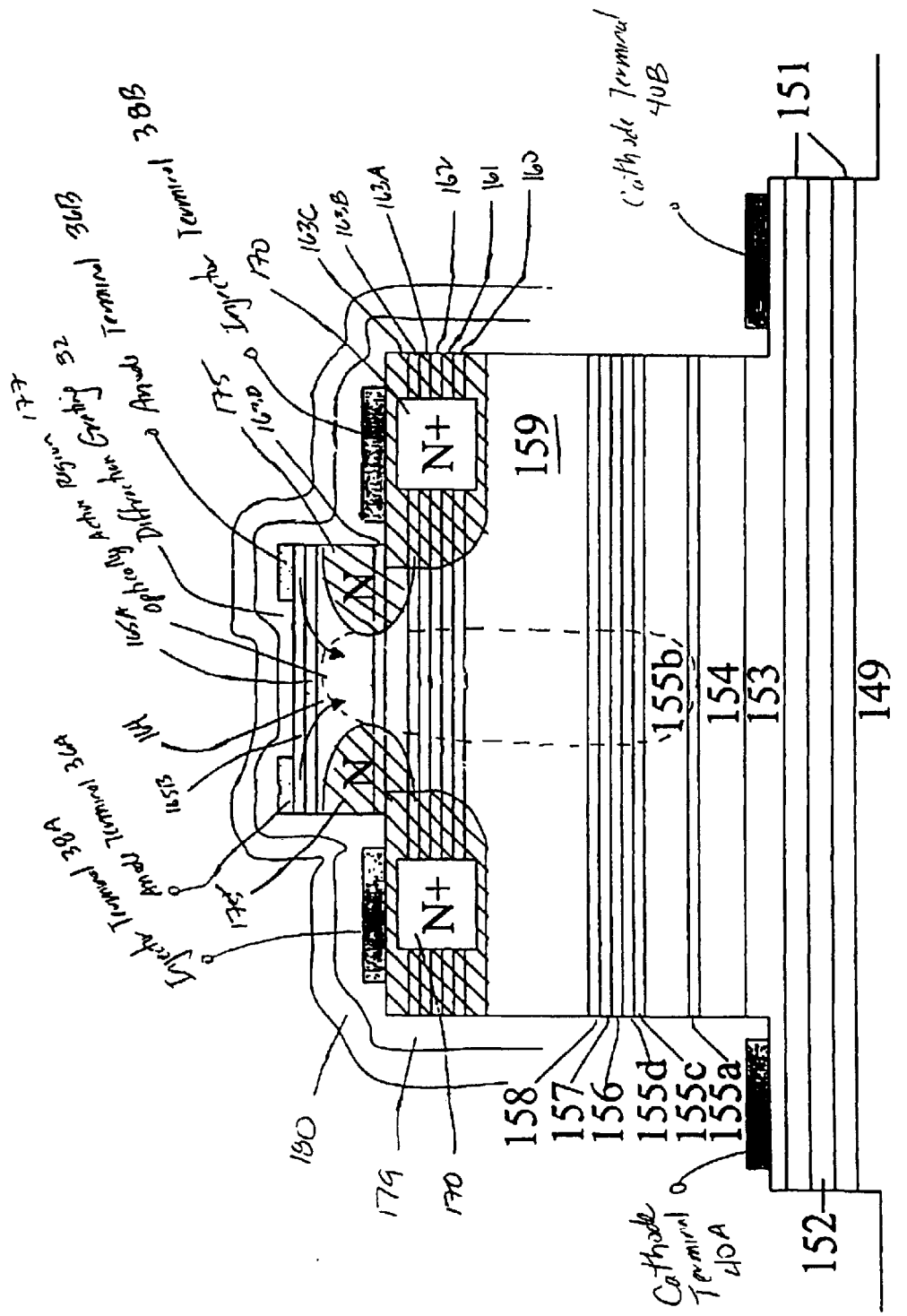
FIG. 2C is a cross-sectional schematic view showing the generalized construction of an exemplary heterojunction thyristor formed from the layer structure of FIG. 2A.

Using the structure described above with respect to FIGS. 2A and 2B, a heterojunction thyristor can be realized as shown in FIG. 2C. To connect to the anode of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. This dielectric layer also forms the first layer of the top DBR mirror. Then an ion implant 175 of n-type is performed using a photomask that is aligned to the alignments marks, and an optical aperture is defined by the separation between the implants 175. The implants 175 create a p-n junction in the layers between the n-type quantum wells and the surface, and the aperture between the implants defines the region in which the current may flow, and therefore the optically active region 177 as shown. The current cannot flow into the n-type implanted regions 175 because of the barrier to current injection. The current flow trajectory is shown in FIG. 2C as arrows. The laser threshold condition is reached before the voltage for turn-on of this barrier. Following the implant, the refractory anode terminals 36A and 36B (which collectively form the anode terminal 36 of the device) are deposited and defined.

N+ ion implants 170 are used to form self-aligned channel contacts to the n-type QW inversion channel(s). More specifically, the N+ implants are used as an etch stop to form a mesa via etching down (for example, to layer 163c) near the n-type QW channel(s). The N+ ion implants 170 are electrically coupled to the injector terminals 38A and 38B (which collectively form the injector terminal 38 of the device). The injector terminals 38A and 38B are preferably formed via deposition of an n-type Au alloy metal on the N+ ion implants 170 to form ohmic contacts thereto. In the event that injector terminals of the device are coupled to the p-type QW inversion channel(s), P+ ion implants (not shown) are used to form self-aligned channel contacts to the p-type QW inversion channel(s). In this case, injector terminals 38A and 38B are preferably formed via deposition of an p-type Au alloy metal on the P+ ion implants to form ohmic contacts thereto.

Alternatively, first injector terminals may be operably coupled to the n-type QW channel(s) while second injector terminals are operably coupled to the P-type QW channel(s). These channel contacts enable switching of the thyristor with n-type and/or p-type high impedance signals via the injector terminals. Connection to the cathode terminals 40A and 40B (which collectively form the cathode terminal 40 of the device) is provided by etching to the N+ bottom layer 153, and depositing a metal layer (for example AuGe/Ni/Au) to form an ohmic contact to N+ bottom layer 153. The resulting structured is isolated from other devices by etching down to the substrate 149. The structure is then subject to rapid thermal anneal (RTA) to activate the implants.

To form a device suitable for in-plane optical injection into a resonant vertical cavity and/or in-plane optical emission from the resonant vertical cavity, a diffraction grating 32 and top DBR mirror 34 is deposited on this structure as described above. To form a device suitable for vertical optical injection into (and/or optical emission from) a resonant vertical cavity, the diffraction grating 32 is omitted. The diffraction grating 32, when used, is created over the active device structure described above. The top DBR mirror 34 is preferably created by the deposition of one or more dielectric layer pairs (179,180), which typically comprise $SiO_2$ and a high refractive index material such as GaAs, Si, or GaN, respectively.

FIG. 2D illustrates an alternate epitaxial growth structure utilizing group III-V materials for realizing a heterojunction thyristor and associated optoelectrical/optical devices in accordance with the present invention. The structure of FIG. 2D can be made, for example, using known molecular beam epitaxy (MBE) techniques. Similar to the growth structure of FIG. 2A, a first semiconductor layer 151 of AlAs and a second semiconductor layer 152 of GaAs are alternately deposited (with preferably at least seven pairs) upon a semi-insulating gallium arsenide substrate 149 in sequence to form the top dielectric distributed bragg reflector (DBR) mirror 12. The number of AlAs layers will preferably always be one greater than the number of GaAs layers so that the first and last layers of the mirror are shown as layer 151. In the preferred embodiment the AlAs layers 151 are subjected to high temperature steam oxidation to produce the compound $Al_xO_y$ so that a mirror will be formed at the designed center wavelength. Therefore the thicknesses of layers 151 and 152 in the mirror are chosen so that the final optical thickness of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the above-described p-channel HFET (PHFET) 11, which has one or more p-type modulation doped quantum wells and is positioned with the gate terminal on the bottom (i.e. on the mirror 12 just described) and the collector terminal above. The second of these is an n-channel HFET (NHFET) 13, which has one or more n-type modulation doped quantum wells and is positioned with the gate terminal on top and the collector terminal below. The collector region of the NHFET device 13 also functions as the collector region of the PHFET device 11. However, the collector terminal of the NHFET device13 is a p-type contact to p-type quantum well(s) disposed below (above) the collector region, while the collector terminal of the PHFET device 11 is a n-type contact to n-type quantum well(s) disposed above the collector region. Therefore a non-inverted n-channel device is stacked upon an inverted p-channel device to form the active device structure.

The active-device layer structure begins with layer 153 of N+ type GaAs that enables the formation of ohmic contacts thereto (for example, when contacting to the cathode terminal of a heterojunction thyristor device, the gate terminal of an inverted p-channel HFET device, the sub-collector terminal of an n-channel HFET device, or the emitter terminal of a p-type quantum-well-base bipolar device). Layer 153 has a typical thickness of 1000–2000 Å and a typical n-type doping of $3.5 \times 10^{18}$ cm$^{-3}$. The N+ doped GaAs layer 153 corresponds to the ohmic contact layer 14 of FIG. 1A. Deposited on layer 153 is layer 166a of n-type AlAs having a typical thickness of 30–200 Å and a typical n-type doping of $3.5 \times 10^{18}$ cm$^{-3}$. One constraint upon the thickness and the doping of this layer 166a is that it should not be depleted in any range of operation of the device, i.e. the total doping in this layer should exceed the total doping charge contained in the layer 155c described below. This layer 166a serves optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. In addition, layer 166a it also acts as a etch stop layer (described below in more detail) when forming contacts to the ohmic contact layer 153. Another constraint on the thickness of layer 166a is that it must be made sufficiently thin to enable hole current to flow through it by tunneling. In this manner, the thickness of this layer 166a determines the current gain of an inverted n-type quantum-well-base bipolar transistor realized in this growth structure. Next is a layer 166b of undoped GaAs having a typical thickness of 6–20 Å. This layer 166b serves to prevent oxidation of the layer 166a during subsequent oxidation operations (e.g., where the bottom DBR mirror layers 151/152 are oxidized). In addition, undoped GaAs layer 166b is advantageous in a single aluminum effusion cell MBE system because it accommodates a growth interruption to change the growth temperature between layers 166a and 155b as required.

Next are three layers (155b, 155c, and 155d) of $Al_{x2}Ga_{1-x2}As$. These three layers have a total thickness about 300–500 Å and where x2 is about 15%. The first layer 155b is about 200–300 Å thick and is undoped. The second layer 155c is about 80 Å thick and is doped P+ type in the form of delta doping with a typical concentration of $3.5 \times 10^{18}$ cm$^{-3}$. And the third layer 155d is about 20–30 Å thick and is undoped. This layer 155d forms the lower separate confinement heterostructure (SCH) layer for the laser, amplifier and modulator devices. The N+ AlAs layer 166a corresponds to the n-type layer 16 of FIG. 1A, and the undoped GaAs layer 166b and the undoped GaAs layer 155b corresponds to the undoped spacer layer 18 of FIG. 1A. To realize a p-type quantum-well-base bipolar transistor (and/or a p-channel HFET) with a cutoff frequency of about 40 GHz, the thickness of layers 166b and 155b are preferably on the order of 300 Å. And to realize a p-type quantum-well-base bipolar transistor (and/or a p-channel HFET) with a cutoff frequency of about 90 GHz, the thickness of layers 166b and 155b are preferably on the order of 250 Å.

The next layers define the quantum well(s) that form the inversion channel(s) during operation of the PHFET 11. For a strained quantum well, this consists of a spacer layer 156 of undoped GaAs that is about 10–25 Å thick and then combinations of a quantum well layer 157 (that is about 40–80 Å thick) and a barrier layer 158 of undoped GaAs. The quantum well layer 157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 $\mu$m, the nitrogen content will be 0%; for a natural emission frequency of 1.3 $\mu$m, the nitrogen content will be approximately 2%; and for a natural emission frequency of 1.5 $\mu$m, the nitrogen content will be approximately 4–5%. The well-barrier combination will typically be repeated (for example, three times as shown) to define the quantum wells that form the inversion channels during operation of the PHFET 11 (however single quantum well structures are also possible). Unstrained quantum wells are also possible. Following the last barrier of undoped GaAs is a layer 167 of undoped AlAs and a layer 159 of undoped $Al_{x2-1}Ga_{1-x2}As$. The undoped AlAs layer 167 has a typical thickness of 10 Å, and the undoped $Al_{x2}Ga_{1-x2}As$ layer 159 has a typical thickness of 0.5 $\mu$m., These layers 167 and 159 form the collector of the PHFET device 11. The purpose of layer 167 is to act as a etch stop layer (described below in more detail) when forming contacts to the p-type inversion channel(s) of the PHFET device 11 (for example, when contacting to the p-channel injector terminal(s) of a heterojunction thyristor device, the source and drain terminals of an inverted p-channel HFET device, the collector terminal of an n-channel HFET device, the collector terminal of an n-type quantum-well-base bipolar transistor, or the base terminal of a p-type quantum-well-base bipolar transistor). It is important to note that layer 167 is an optional layer whose only purpose is to provide an etch stop to provide excellent contact to the p-type implant as described below in detail. This layer 167 performs no electrical purpose and so it should be electrically totally transparent to all current flows. Therefore, layer 167 is thin enough that currents may pass through it by tunneling with negligible voltage drop. Layer 167 is not essential for proper functioning of the device. All of the layers grown thus far form the PHFET device 11 with the gate contact on the bottom. The layers between the P+ AlGaAs layer 155c and the last undoped GaAs barrier layer 158 correspond to the p-type modulation doped heterojunction QW structure 20 of FIG. 1A. Undoped AlAs layer 167 and undoped AlGaAs layer 159 corresponds to the undoped spacer layer 22 of FIG. 1A.

Layers 167 and 159 also form the collector region of the NHFET device 13. Deposited on layer 159 are two layers 160a, 160b (collectively 160) of undoped GaAs of about 200–250 Å total thickness, which form the barrier of the first n-type quantum well. Layer 160 is thicker than the normal barrier layer of about 100 Å because it accommodates the growth interruption to change the growth temperature from 610° C. (as required for optical quality $Al_{x2}1Ga_{1-x2}As$ layers) to about 530° C. for the growth of InGaAs. The next layer 161 is the quantum well of $In_{0.2}Ga_{0.8}As$, which is undoped and about 40–80 Å in thickness. The quantum well layer 161 may be comprised of a range of compositions as described above with respect to the quantum well layer 157. In the preferred embodiment, the quantum well is formed from an $In_{0.2}Ga_{0.8}AsN$ composition with the nitrogen content varying from 0% to 5% depending upon the desired natural emission frequency. It is noted that the n-type quantum well layer 161 need not be of the same formulation as the p-type quantum well layer 157. The barrier-well combination will typically be repeated (for example, three times as shown) to define the quantum wells that form the inversion channel(s) during operation of the NHFET 13. Then there is a barrier layer 162 of about 10–30 Å of undoped GaAs which accommodates a growth interruption and a change of growth temperature.

Next there are three layers (163a, 163b, 163c) of $Al_{x2}1Ga_{1-x2}As$ of about 300–500 Å total thickness. These three layers include a spacer layer 163a of undoped $Al_{x2}1Ga_{1-x2}As$ that is about 20–30 Å thick, a modulation doped layer 163b of N+ type doping of $Al_{x2}1Ga_{1-x2}As$ (with doping about $3.5 \times 10^{18}$ cm$^{-3}$) that is about 80 Å thick, and a spacer layer 163c of undoped $Al_{x2}1Ga_{1-x2}As$ that is about 200–300 Å thick. Next is a layer 168a of undoped GaAs that is about 6–20 Å thick, and a P+ type doped layer 168b of AlAs (with doping about $3.5 \times 10^{18}$ cm$^{-3}$) that is about 300 Å. In contrast to layer 163b which is always depleted, layer 168b should never be totally depleted in operation (i.e., the total doped charge in layer 168b should always exceed that in layer 163b). Layers 168b and 163b (and the undoped spacer layers 163c and 168a therebetween) form the two plates of a parallel plate capacitor which forms the field-effect input to all active devices. For the optoelectronic device operation, layer 163a is the upper SCH region. Layer 168b also acts as a etch stop layer (described-below in more detail) when forming contacts to the N-type inversion channel(s) of the NHFET 13 (for example, when contacting to the N-channel injector terminal(s) of a heterojunction thyristor device, the source/drain terminals of an n-channel HFET device, the base terminal of an n-type quantum-well-base bipolar transistor, or the collector terminal of a p-type quantum-well-base bipolar transistor). Layer 168a serves to prevent oxidation of previous layers 163a, 163b, 163c of $Al_{x2}1Ga_{1-x2}As$ during subsequent oxidation operations (e.g., where the bottom DBR mirror layers are oxidized). Moreover, similar to layer 166b, layer 168a must be made sufficiently thin to enable electron current to flow through it by tunneling. In this manner, the thickness of this layer 168a determines the current gain of a p-type HBT transistor device realized in this growth structure. In addition, undoped GaAs layer 168a is advantageous in a single aluminum effusion cell MBE system because it accommodates a growth interruption to change the growth temperature between layers 163c and 168b as required. The layers between the undoped GaAs barrier layer 160a and the N+ AlGaAs layer 163b correspond to the n-type modulation doped heterojunction QW structure 24 of FIG. 1A. Undoped AlGaAs layer 163c and undoped GaAs layer 168a corresponds to the undoped spacer layer 26 of FIG. 1A. To realize an n-type quantum-well-base bipolar transistor (and/or an n-channel HFET) with a cutoff frequency of about 40 GHz, the thickness of layers 163c and 168a are preferably on the order of 300 Å. And to realize an n-type quantum-well-base bipolar transistor (and/or an n-channel HFET) with a cutoff frequency of about 90 GHz, the thickness of layers 163c and 168a are preferably on the order of 250 Å.

A layer 164 of p-type GaAs is deposited next to form part of the upper waveguide cladding layer for the laser, amplifier and modulator devices. Note that a majority of the upper waveguide cladding for waves propagating in the guide formed by the optically active region of the device is provided by the upper DBR mirror itself. The upper DBR mirror causes the light to be guided partially as a dielectric waveguide and partially as a mirror waveguide. Layer 164 also forms a spacer layer in which to accommodate the aperture implant which steers the current into the VCSEL active region. It should provide a low resistance access to the top contact. It has a typical thickness of 300 Å. The p-type layers 168b and 164 correspond to the p-type layer(s) 28 of FIG. 1A.

Deposited next is an ohmic contact layer 165 (which may comprise a single layer of GaAs or a combination of GaAs (165a) and InGaAs (165b) as shown). In the illustrative embodiment shown, GaAs layer 165a is about 50–100 Å thick and doped to a very high level of P+ type doping (about $1 \times 10^{20}$ cm$^{-3}$) and InGaAs layer 165b is about 25–50 Å thick and doped to a very high level of P+ type doping (about $1 \times 10^{20}$ cm$^{-3}$) to enable the best possible ohmic contact.

Alternatively, the active device structure may be described as a pair of stacked quantum-well-base bipolar transistors formed on the bottom DBR mirror (layers 151/152). The first of these is an n-type quantum-well-base bipolar transistor (comprising layers 153 through 159) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 159 through 165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminal 40 of the heterojunction thyristor device corresponds to the emitter electrode of the p-type quantum-well-base bipolar transistor, the p-type QW structure (layers 155c though 158) corresponds to the base region of the p-type quantum-well-base bipolar transistor, spacer layer 159 corresponds to the collector region of both the p-type quantum-well-base bipolar transistor and the n-type quantum-well-base bipolar transistor, the n-type QW structure (layers 160a through 163b) corresponds to the base region of the n-type quantum-well-base bipolar transistor, and the anode terminal 36 of the heterojunction thyristor device corresponds to the emitter electrode of the n-type quantum-well-base bipolar transistor.

Figure 2E:
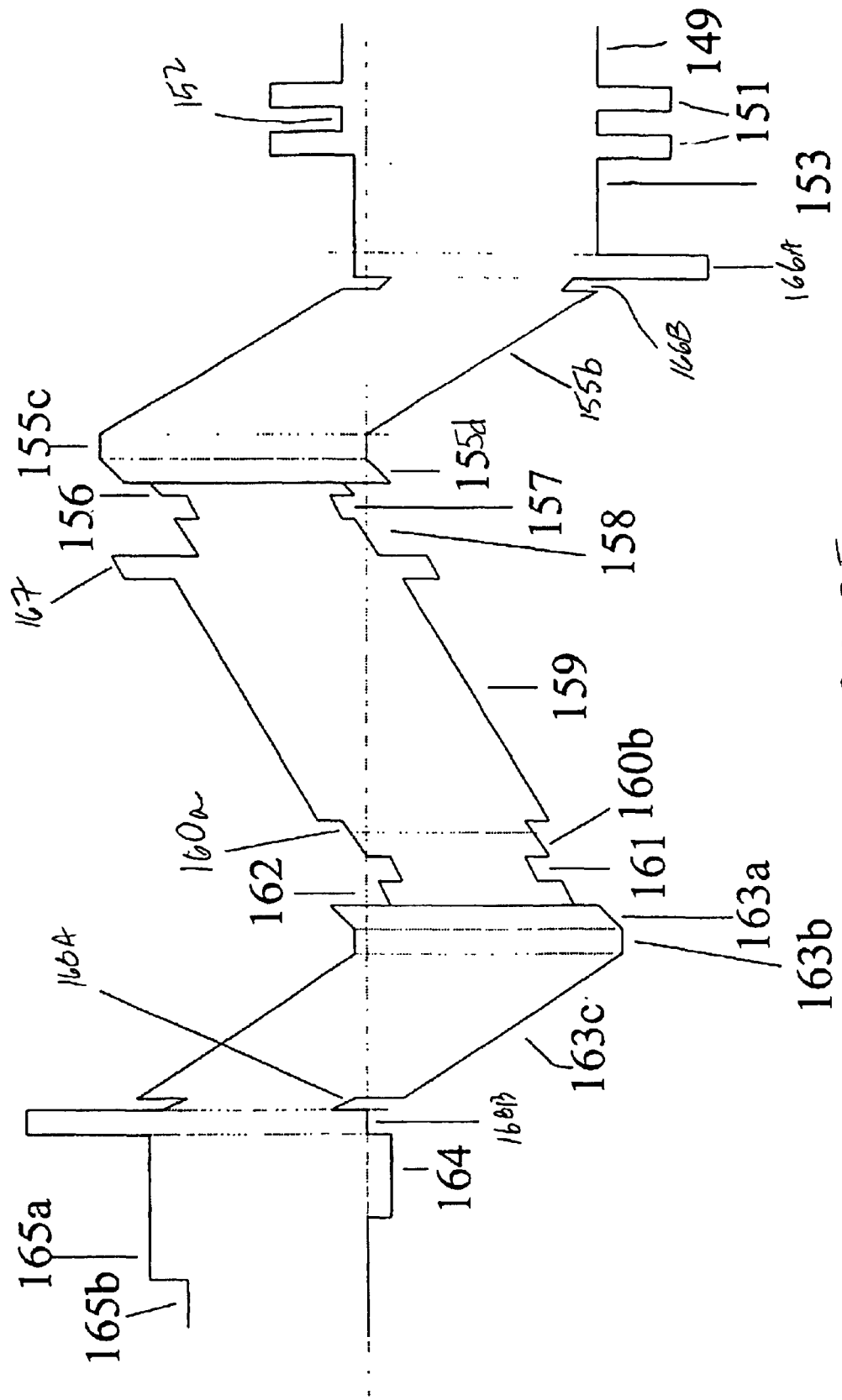
FIG. 2E shows the energy band diagram of the structure of FIG. 2D.

The band diagram of the FIG. 2D structure is shown in FIG. 2E.

To form a resonant cavity device where light is input into and emitted from the device laterally (i.e., from a direction normal to the cross section of FIG. 2D), a diffraction grating and top DBR mirror is formed over the active device structure described above. When the heterojunction thyristor device is operating in the lasing mode, the diffraction grating performs the function of diffracting light produced by the vertical cavity into light propagating laterally in a waveguide which has the top DBR mirror and bottom DBR mirror as waveguide cladding layers and which has lateral confinement regions (typically formed by implants as described herein in more detail). When the heterojunction thyristor device is operating in the optical detection mode, the diffraction grating performs the function of diffracting incident light that is propagating in the lateral direction into the vertical cavity mode, where it is absorbed resonantly in the vertical cavity.

Alternatively, light may enter and exit the resonant vertical cavity vertically through an optical aperture in the top surface of the device. In this case, the diffraction grating is omitted, the top DBR mirror defines a cavity for the vertical emission and absorption of light, and the device operates as a vertical cavity surface emitting laser/detector. The distance between the top DBR mirror and bottom DBR mirror preferably represents an integral number of ¼ wavelengths at the designated wavelength. Preferably, the thickness of layer 164 or 159 is adjusted to enable this condition.

Figure 2F:
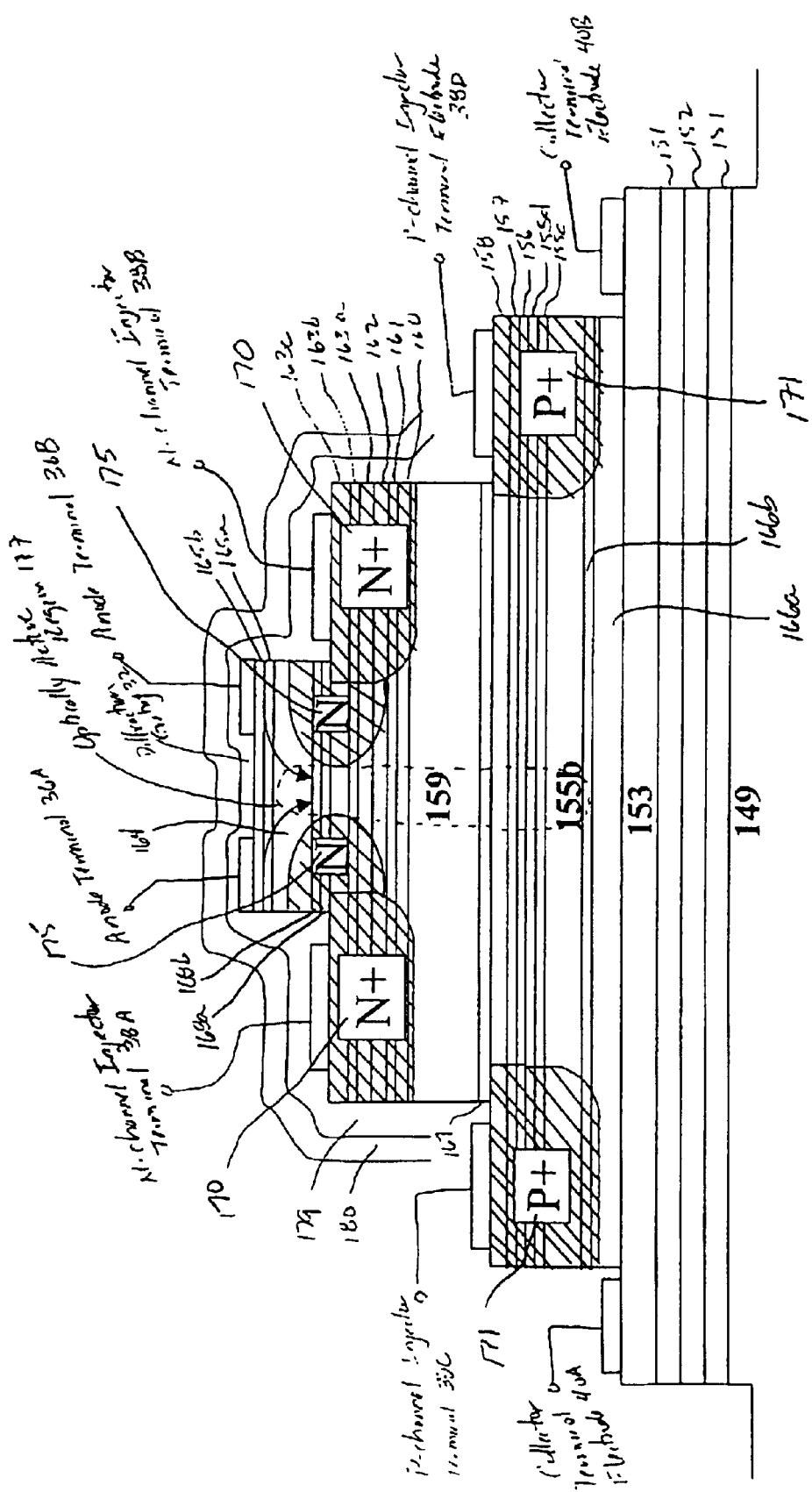
FIG. 2F is a cross-sectional schematic view showing the generalized construction of an exemplary heterojunction thyristor formed from the layer structure of FIG. 2D.

Using the structure described above with respect to FIGS. 2D and 2E, a heterojunction thyristor can be realized as shown in FIG. 2F. To connect to the anode of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Preferably, this dielectric layer also forms the first layer of the top DBR mirror. Then an ion implant 175 of n-type is performed using a photomask that is aligned to the alignments marks, and an optical aperture is defined by the separation between the implants 175. The implants 175 create a p-n junction in the layers between the n-type quantum well(s) and the surface, and the aperture between the implants defines the region in which the current may flow, and therefore the optically active region 177 as shown. The current cannot flow into the n-type implanted regions 175 because of the barrier to current injection. The current flow trajectory is shown in FIG. 2F as arrows. The laser threshold condition is reached before the voltage for turn-on of this barrier. Following the implant 175, the refractory anode terminals 36A and 36B (which collectively form the anode terminal 36 of the device) are deposited and defined.

Then an ion implant 170 of n+-type is performed using a photomask that is aligned to the alignments marks, to thereby form contacts to the n-type QW inversion channel(s). During this operation, a chlorine-based gas mixture that includes fluorine is used as an etchant to etch down to the etch-stop layer 168b. The etch rate through the InGaAs layer 165b and GaAs layers (165a and 164) is fairly rapid. However, because of the presence of fluorine in the etchant, the etch rate decreases drastically when the AlAs layer 168b is encountered. This is because the AlAs layer 168b has a high percentage of Aluminum, which forms AlF in the presence of the etch mixture. The AlF deposits on the surface of the structure and prevents further etching (because it is non-volatile and not etched by any of the conventional etchants). In this manner, the AlAs layer 168b operates as an etch stop layer. This layer is then easily dissolved in de-ionized (DI) water or wet buffered hydrofluoric acid (BHF) to form mesas at the undoped GaAs layer 168a. The resulting mesas at the undoped GaAs layer 168a is subject to the N+ ion implants 170, which are electrically coupled to the N-channel injector terminals 38A and 38B.

The N-channel injector terminals 38A and 38B are preferably formed via deposition of an n-type Au alloy metal on the N+ ion implants 170 to form ohmic contacts thereto.

Then an ion implant 171 of p+-type is performed using a photomask that is aligned to the alignments marks, to thereby form contacts to the p-type QW inversion channel(s). During this operation, a chlorine-based gas mixture that includes fluorine is used as an etchant to etch down to the etch-stop layer 167 as described above. This etch layer 167 is then easily dissolved in de-ionized (DI) water or wet buffered hydrofluoric acid (BHF) to form mesas at the undoped GaAs layer 158. The resulting mesas at the undoped GaAs layer 158 are then subject to P+ ion implants 171, which are electrically coupled to the P-channel injector terminals 38C and 38D. The P-channel injector terminals 38C and 38D are preferably formed via deposition of an p-type alloy metal on the P+ ion implants 171 to form ohmic contacts thereto.

In alternative embodiments, the P+ ion implants 171 (and corresponding P-channel injector terminals 38C and 38D) may be omitted. In such a configuration, the N-channel injector terminals 38A and 38B (which are coupled to the n-type inversion QW channel(s) of the NHFET 13 device by the N+ ion implants 170) are used to control charge in such n-type inversion QW channel(s) as described herein. In yet another alternative embodiment, the N+ ion implants 170 (and corresponding N-channel injector terminals 38A and 38B) may be omitted. In such a configuration, the P-channel injector terminals 38C and 38D (which are coupled to the p-type inversion QW channel(s) of the PHFET 11 device by the P+ ion implants 171) are used to control charge in such p-type inversion QW channel(s) as described herein.

Connection to the cathode terminals 40A and 40B the device is made by etching with a chlorine-based gas mixture that includes fluorine. This etch is performed down to the AlAs etch stop layer 166a as described above. This layer 166a is then easily dissolved in de-ionized (DI) water or wet buffered hydrofluoric acid (BHF) to form resulting mesas in the N+ layer 153. A metal layer (for example AuGe/Ni/Au) is deposited on the mesas at the N+ layer 153 to formed an ohmic contact thereto. The resulting structured is isolated from other devices by etching down to the substrate 149. The structure is then subject to rapid thermal anneal (RTA) to activate the implants.

To form a device suitable for in-plane optical injection into a resonant vertical cavity and/or in-plane optical emission from the resonant vertical cavity, a diffraction grating 32 and top DBR mirror 34 is deposited on this structure as described above. To form a device suitable for vertical optical injection into (and/or optical emission from) a resonant vertical cavity, the diffraction grating 32 is omitted. The top DBR mirror 34 is preferably created by the deposition of one or more dielectric layer pairs (179,180), which typically comprise $SiO_2$ and a high refractive index material such as GaAs, Si, or GaN, respectively.

When the heterojunction thyristor devices described herein are configured as an optical detector/emitter, i.e., an optical detector that detects an input optical pulse and a vertical cavity laser that produces a corresponding output optical pulse in response to a detected input pulse, the time delay ($t_{delay}$) between input optical pulse (referred to herein as "trigger optical pulse" or "trigger pulse") and the output optical pulse/output electrical pulse corresponding thereto is given by:

$$t_{delay} = t_{intrinsic} + t_{trigger} \qquad (1)$$

where $t_{intrinsic}$ is the intrinsic time delay of the device, which is based upon fabrication and growth parameters of the device (and is typically on the order of 2 to 5 picoseconds).

The parameter $t_{trigger}$ is related to the effective area of the thyristor, threshold charge density, and the charging current as follows:

$$A * \sigma_{trigger} = Q_{trigger} = I_{trigger} * t_{trigger} \qquad (2)$$

where

A is the effective area of thyristor;
$\sigma_{trigger}$ is the threshold charge density;
$Q_{trigger}$ is the threshold charge; and
$I_{trigger}$ is the charging or trigger current.

The charging current $I_{trigger}$ relates to the optically induced photocurrent and the bias current as follows:

$$I_{trigger} = I_{input} - I_{BIAS} \qquad (3)$$

where $I_{input}$ is the optically induced photocurrent; and
$I_{BIAS}$ is the bias current provided by the bias current source that draws current from the gate electrode and charge from the n-type channel.

The optically induced photocurrent $I_{input}$ is given by:

$$I_{input} = \eta_i * P_{input} \qquad (4)$$

where $\eta_i$ represents the efficiency of the thyristor; and
$P_{input}$ is the power of input optical pulse.

Solving equation (2) for the parameter $I_{trigger}$ using equations (3) and (4) for the parameter $T_{trigger}$ yields:

$$t_{trigger} = Q_{trigger} / I_{trigger} \qquad (5)$$

$$t_{trigger} = \frac{A * \sigma_{trigger}}{(\eta_1 * P_{input}) - I_{bias}} \qquad (6)$$

From inspection of equations (6), (5) and (1), if the optical power of input optical pulse is held constant ($P_{input}$ is constant), an increase in the bias current $I_{bias}$ leads to a decrease in $I_{trigger}$, an increase in $t_{trigger}$, and an increase in $t_{delay}$; in contrast, a decrease in the bias current $I_{bias}$ leads to an increase in $I_{trigger}$, a decrease in $t_{trigger}$, and a decrease in $t_{delay}$.

Similarly, from the inspection of equations (6), (5) and (1), if the bias current is held constant ($I_{bias}$ is constant), an increase in the optical power of the input pulse (increase in $P_{input}$) leads to an increase in $I_{trigger}$, a decrease in $t_{trigger}$, and a decrease in $t_{delay}$; in contrast, a decrease in the optical power of the input pulse (decrease in $P_{input}$) leads to an decrease in $I_{trigger}$, an increase in $t_{trigger}$, and an increase in $t_{delay}$.

Note that the value of the load resistance controls the intensity of the output optical pulse and amplitude of the output electrical pulse. The minimum value of $t_{delay}$ is provided by the intrinsic time delay $t_{intrinsic}$, is the intrinsic time delay of the device, which is typically on the order of 2 to 5 picoseconds. The maximum value of $t_{delay}$ is determined by the choice of A, $P_{input}$, and $I_{bias}$. For example, for a large device on the order of 10 μm by 1000 μm and a bias current $I_{Bias}$ set equal to the photocurrent induced by the input optical pulse within 2 microamperes, the maximum value of $t_{delay}$ is in the range of several microseconds.

Figure 3A:
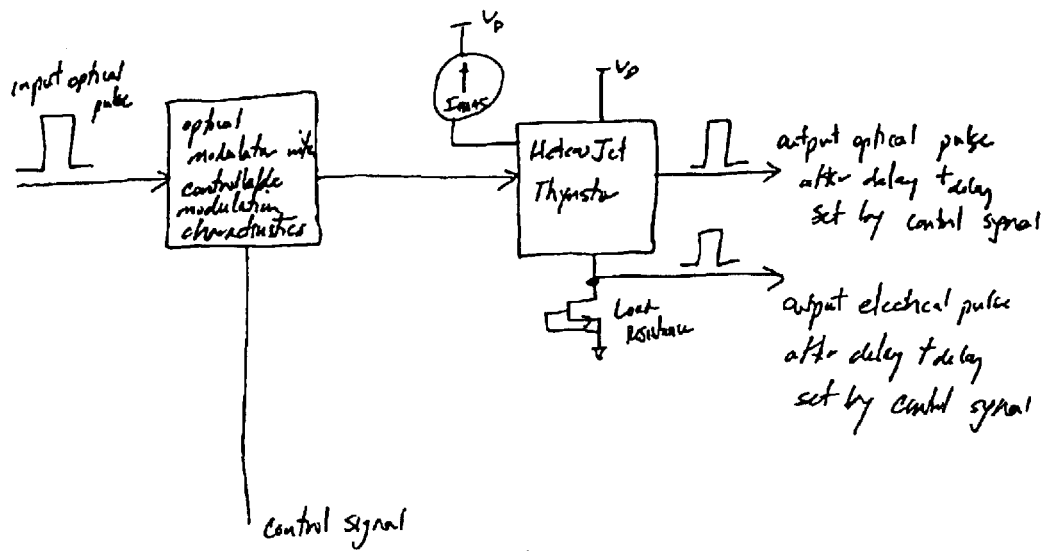
FIG. 3A is a schematic illustrating the use of an analog optical modulator and heterojunction thyristor that operate to detect an input optical pulse, and produce an output optical pulse (and output electrical pulse) with variable time delay between the input optical pulse and the output optical pulse (and output electrical pulse).

In accordance with the present invention, these relationships are exploited to control the time delay ($t_{delay}$) between the trigger optical pulse and the output optical pulse, to thereby provide a variable optical pulse delay that is selectable by a control signal. In FIG. 3A, an analog optical modulator operates in response to a control signal to modulate the optical intensity level (and thus the optical power level) of the trigger optical pulse. The heterojunction thyristor is configured for detection/emission with a constant current source that provides a constant bias current source that draws current from the injector electrode and charge from the control channel of the device as described herein. In this embodiment, the time delay ($t_{delay}$) is decreased by a control signal that causes the analog optical modulator to increase the optical intensity level (and thus increase the optical power level) of the trigger pulse. As described above, an increase in $P_{input}$ leads to an increase in $I_{trigger}$, a decrease in $t_{trigger}$, and a decrease in $t_{delay}$. In contrast, the time delay ($t_{delay}$) is increased by a control signal that causes the analog optical modulator to decrease the optical intensity level (and thus decrease the optical power level) of the trigger pulse. As described above, a decrease in $P_{input}$ leads to a decrease in $I_{trigger}$, an increase in $t_{trigger}$, and an increase in $t_{delay}$. In this manner, the control signal sets the time delay between the trigger optical pulse and the corresponding output optical pulse and output electrical pulse. Note that in the event that a succession of optical pulses is applied to the heterojunction thyristor of the present invention, the pulse train can only be effectively delayed if the period between pulses is longer that the time delay $t_{delay}$.

Figure 4A:
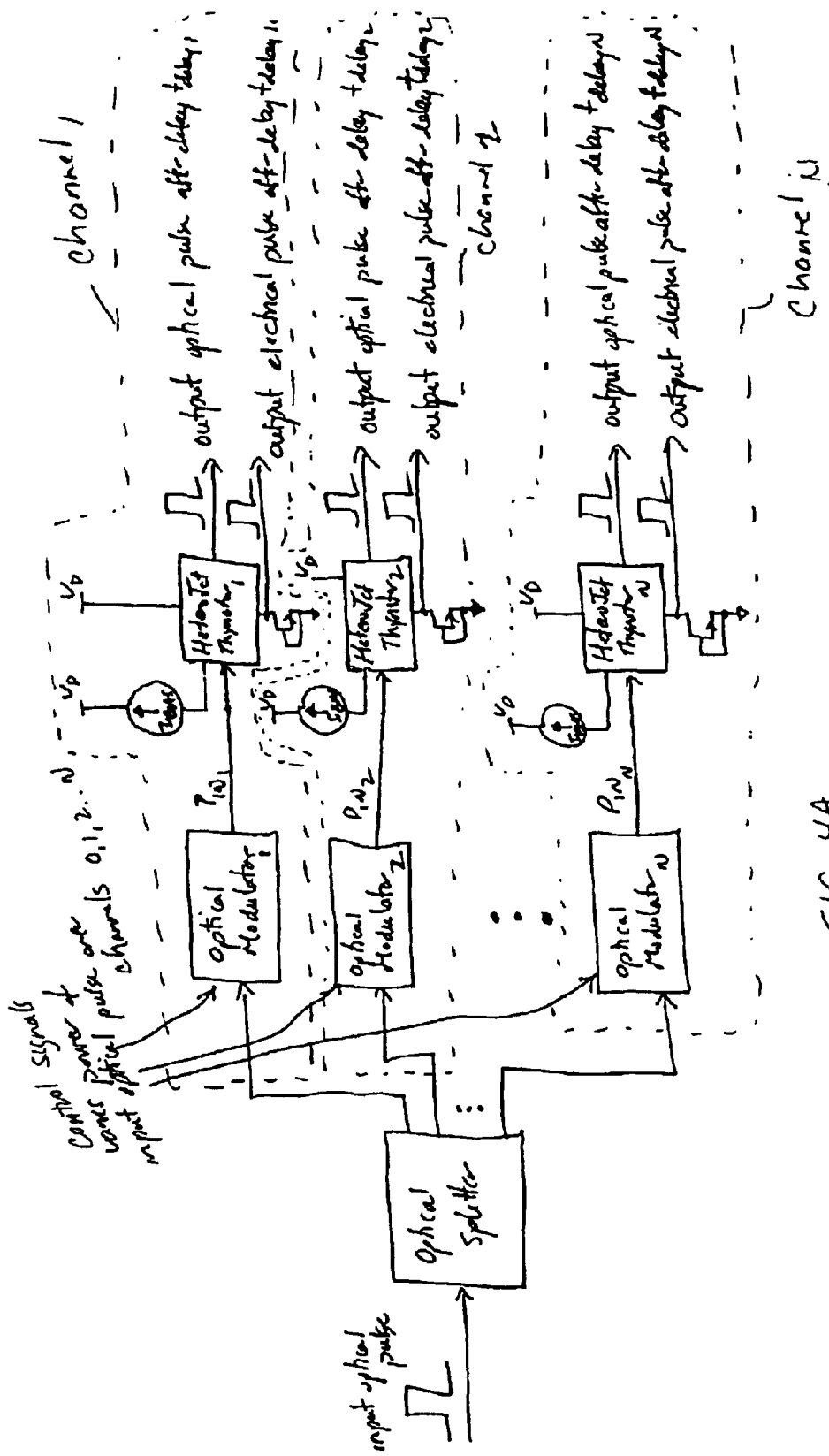
FIG. 4A depicts a system wherein the configuration of FIG. 3A is exploited to provide variable pulse delays over a plurality (N) of channels.

The configuration of FIG. 3A can be exploited to provide variable optical pulse delay over a plurality (N) of channels as shown in FIG. 4A. The input optical pulse is provided to the plurality of channels 1, 2 . . . N by an optical splitter. Each channel includes an analog optical modulator and heterojunction transistor as described above in FIG. 3A. Preferably, the optical path length between the optical splitter and the optical modulator and between the optical modulator and the heterojunction thyristor in each channel are substantially the same. The analog optical modulator in each given channel operates in response to a control signal supplied thereto to modulate the intensity level of the trigger optical pulse provided thereto. The heterojunction thyristor in each given channel is configured for optical detection/emission with a constant current source that provides a constant bias current source that draws current from the injector electrode and therefore charge from the control channel of the device as described herein. In this manner, the control signals for the channels set the time delay between the trigger optical pulse and the corresponding output optical pulse and output electrical pulse in each channel.

Figure 3B:
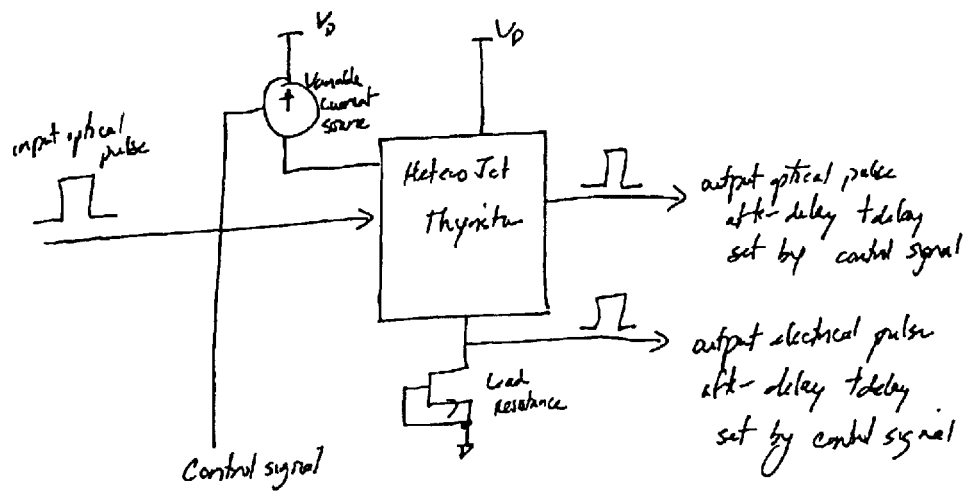
FIG. 3B is a schematic illustrating the use of a variable current source and heterojunction thyristor that operate to detect an input optical pulse, and produce an output optical pulse (and output electrical pulse) with variable time delay between the input optical pulse and the output optical pulse (and output electrical pulse).

In FIG. 3B, the heterojunction thyristor is configured for optical detection/emission with a variable current source that operates in response to a control signal to provide a variable bias current that draws current from the injector electrode and charge from the control channel of the device as described herein. In this embodiment, the time delay ($t_{delay}$) is decreased by a control signal that causes the variable current source to decrease the bias current $I_{bias}$. As described above, a decrease in bias current $I_{bias}$ leads to an increase in $I_{trigger}$, a decrease in $t_{trigger}$, and a decrease in $t_{delay}$. In contrast, the time delay ($t_{delay}$) is increased by a control signal that causes the variable current source to increase the bias current $I_{bias}$. As described above, an increase to the bias current $I_{bias}$, leads to an decrease in $I_{trigger}$, an increase in $t_{trigger}$, and an increase in $t_{delay}$. In this manner, the control signal sets the time delay between the trigger optical pulse and the corresponding output optical pulse and output electrical pulse. Note that in the event that a succession of optical pulses is applied to the heterojunction thyristor of the present invention, the pulse train can only be effectively delayed if the period between pulses is longer than the time delay $t_{delay}$.

Figure 4B:
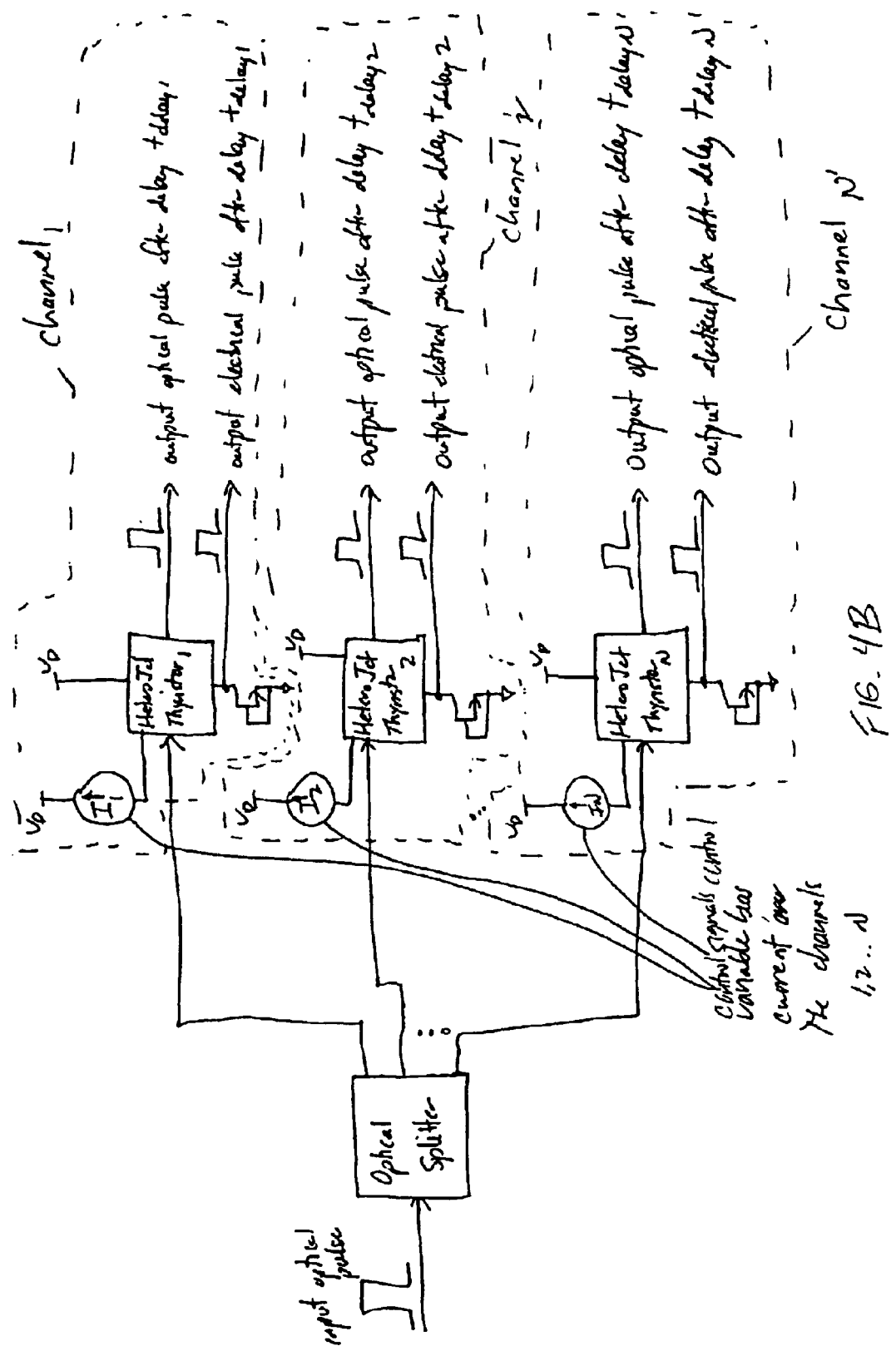
FIG. 4B depicts a system wherein the configuration of FIG. 3B is exploited to provide variable pulse delays over a plurality (N) of channels.

Similarly, the configuration of FIG. 3B can be exploited to provide variable optical pulse delay over a plurality (N) of channels as shown in FIG. 4B. The input optical pulse is provided to the plurality of channels 1, 2 . . . N by an optical splitter. Each channel includes a heterojunction thyristor configured for optical detection/emission with a variable current source as described above in FIG. 3B. Preferably, the optical path length between the optical splitter and the heterojunction thyristor in each channel are substantially the same. The variable current source in each channel operates in response to a control signal supplied thereto to provide a variable bias current that draws current from the injector electrode and charge from the control channel of the device as described herein. In this manner, the control signals for the channels set the time delay between the trigger optical pulse and the corresponding output optical pulse and output electrical pulse in each channel.

When the heterojunction thyristor device described herein is configured as an electrical detector/emitter, i.e., an electrical detector that detects an input electrical pulse and a vertical cavity laser that produces a corresponding output optical pulse in response to a detected input electrical pulse, the time delay ($t_{delay}$) between the input electrical pulse (referred to herein as "trigger electrical pulse" or "trigger pulse") and the output optical pulse/output electrical pulse can be similarly controlled by: i) varying the intensity level (and thus varying the power level) of the input electrical pulse, or ii) varying the level of the bias current $I_{bias}$.

More specifically, if the intensity level (and corresponding power level) of the input electrical pulse is held constant, an increase in the bias current $I_{bias}$ leads to an increase in $t_{delay}$; in contrast, a decrease in the bias current $I_{bias}$ leads to a decrease in $t_{delay}$. Alternatively, if the bias current $I_{bias}$ is held constant, an increase in the intensity (and corresponding increase in power level) of the input electrical pulse leads to a decrease in $t_{delay}$; in contrast, a decrease in the intensity (and corresponding decrease in power level) of the input electrical pulse leads to an increase in $t_{delay}$.

Note that the value of the load resistance controls the intensity of the output optical pulse and amplitude of the output electrical pulse.

Figure 3C:
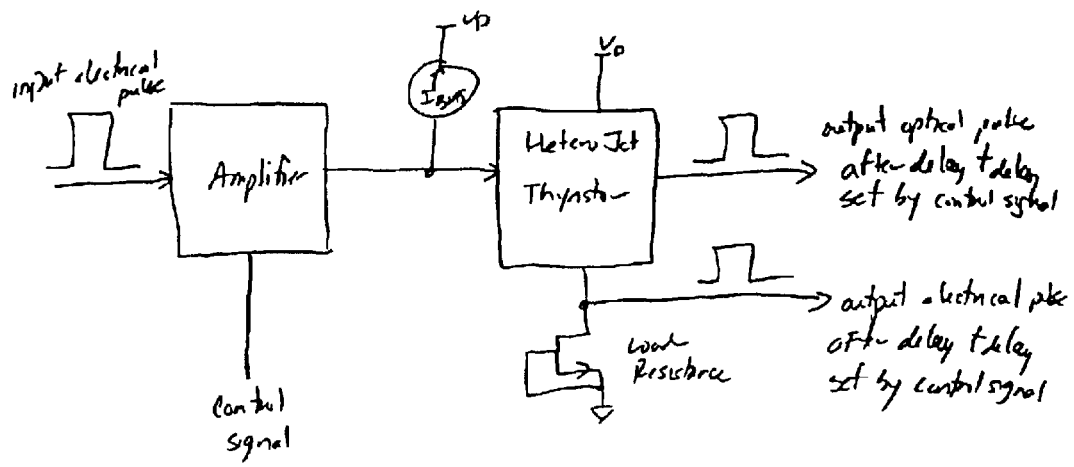
FIG. 3C is a schematic illustrating the use of an amplifier and heterojunction thyristor that operate to detect an input electrical pulse, and produce an output optical pulse (and output electrical pulse) with variable time delay between the input electrical pulse and the output optical pulse (and output electrical pulse).

In accordance with the present invention, these relationships are exploited to control the time delay ($t_{delay}$) between the trigger electrical pulse and the output optical pulse/output electrical pulse, to thereby provide a variable pulse delay that is selectable by a control signal. In FIG. 3C, an amplifier operates in response to a control signal to modulate the intensity (and corresponding power level) of the trigger electrical pulse. The heterojunction thyristor is configured for electrical detection/emission with a constant current source that provides a constant bias current source that draws current from the injector electrode and charge from the control channel of the device as described herein. In this embodiment, the time delay ($t_{delay}$) is decreased by a control signal that causes the amplifier to increase the intensity (and corresponding increase in the power level) of the trigger electrical pulse. In contrast, the time delay ($t_{delay}$) is increased by a control signal that causes the amplifier to decrease the intensity (and corresponding decrease in the power level) of the trigger electrical pulse. In this manner, the control signal sets the time delay between the trigger electrical pulse and the corresponding output optical pulse and output electrical pulse. Note that in the event that a succession of electrical pulses is applied to the heterojunction thyristor of the present invention, the pulse train can only be effectively delayed if the period between pulses is longer than the time delay $t_{delay}$.

Figure 4C:
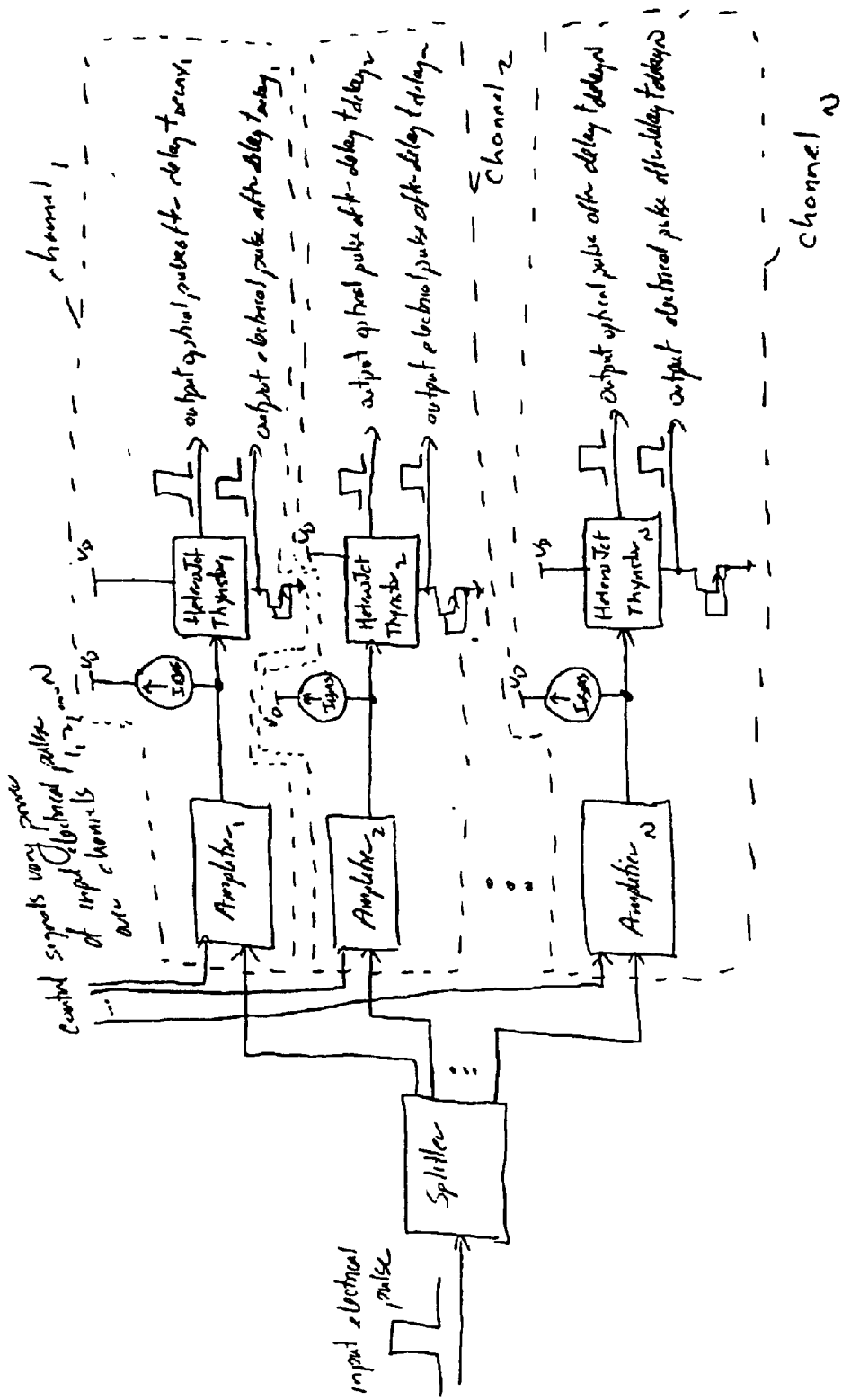
FIG. 4C depicts a system wherein the configuration of FIG. 3C is exploited to provide variable pulse delays over a plurality (N) of channels.

The configuration of FIG. 3C can be exploited to provide variable pulse delay over a plurality (N) channels as shown in FIG. 4C. The input electrical pulse is provided to the plurality of channels 1, 2 . . . N by a splitter. Each channel includes an amplifier and heterojunction transistor as described above in FIG. 3C. Preferably, the signal path length between the splitter and the amplifier and between the amplifier and the heterojunction thyristor in each channel are substantially the same. The amplifier in each given channel operates in response to a control signal supplied thereto to modulate the intensity (and corresponding power level) of the trigger electrical pulse provided thereto. The heterojunction thyristor in each given channel is configured for electrical detection/emission with a constant current source that provides a constant bias current source that draws current from the injector electrode and therefore charge from the control channel of the device as described herein. In this manner, the control signals for the channels set the time delay between the trigger electrical pulse and the corresponding output optical pulse and output electrical pulse in each channel.

Figure 3D:
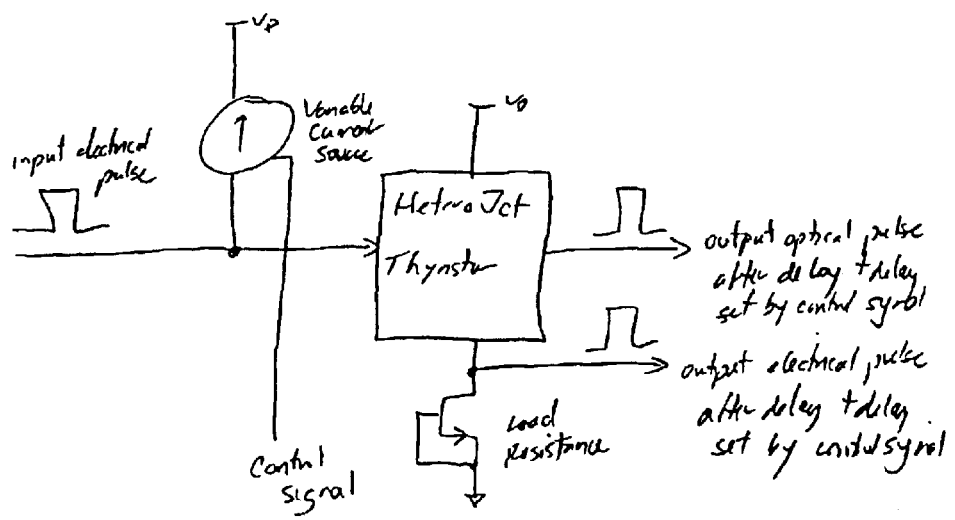
FIG. 3D is a schematic illustrating the use of a variable current source and heterojunction thyristor that operate to detect an input electrical pulse, and produce an output optical pulse (and output electrical pulse) with variable time delay between the input electrical pulse and the output optical pulse (and output electrical pulse).

In FIG. 3D, the heterojunction thyristor is configured for electrical detection/emission with a variable current source that operates in response to a control signal to provide a variable bias current that draws current from the injector electrode and charge from the control channel of the device as described herein. In this embodiment, the time delay ($t_{delay}$) is decreased by a control signal that causes the variable current source to decrease the bias current $I_{bias}$. In contrast, the time delay ($t_{delay}$) is increased by a control signal that causes the variable current source to increase the bias current $I_{bias}$. In this manner, the control signal sets the time delay between the trigger electrical pulse and the corresponding output optical pulse and output electrical pulse. Note that in the event that a succession of electrical pulses is applied to the heterojunction thyristor of the present invention, the pulse train can only be effectively delayed if the period between pulses is longer than the time delay $t_{delay}$.

Figure 4D:
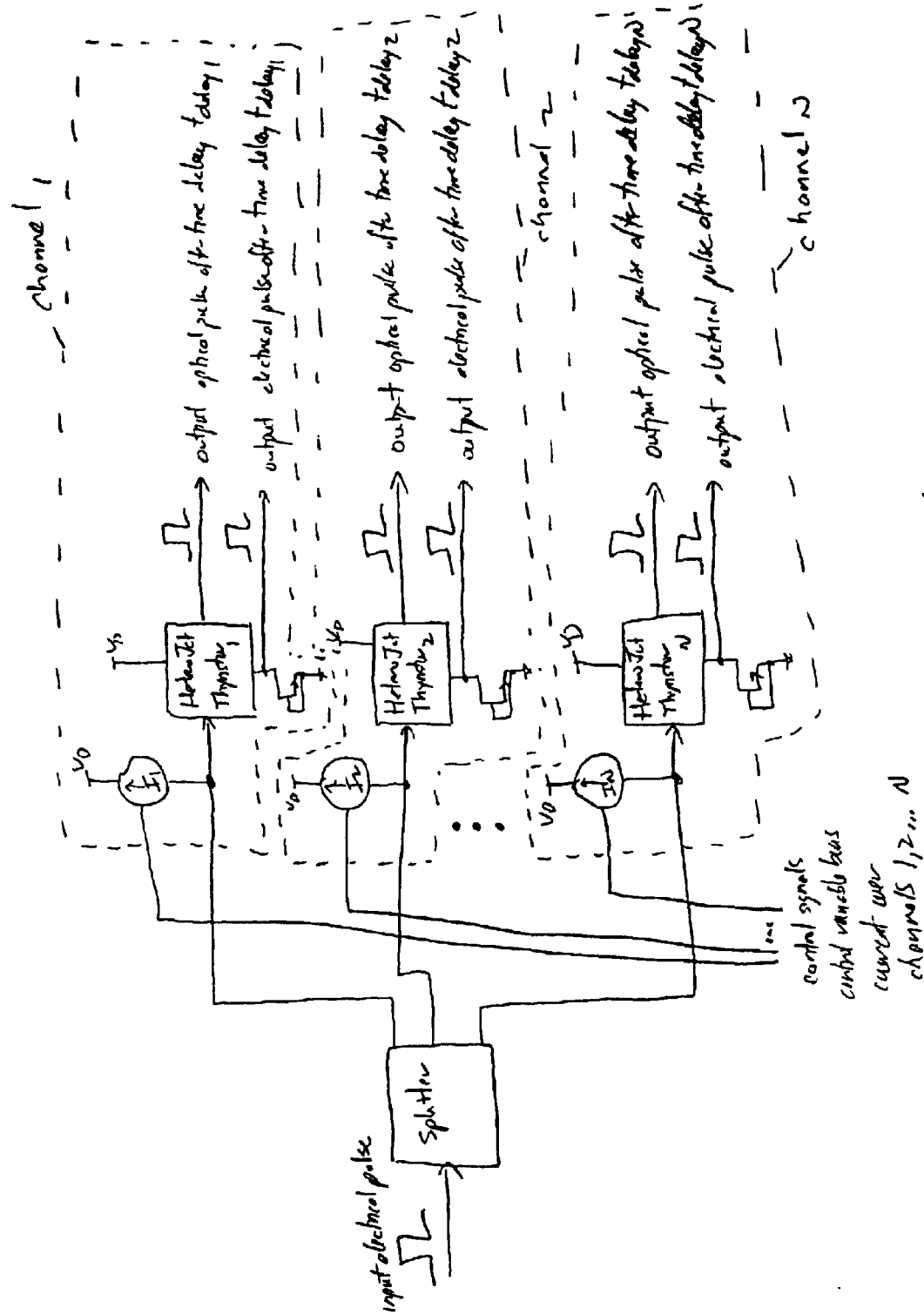
FIG. 4D depicts a system wherein the configuration of FIG. 3D is exploited to provide variable pulse delays over a plurality (N) of channels.

Similarly, the configuration of FIG. 3D can be exploited to provide variable pulse delay over a plurality (N) channels as shown in illustrated in FIG. 4D. The input electrical pulse is provided to the plurality of channels 1, 2 . . . N by a splitter. Each channel includes a heterojunction thyristor configured for electrical detection/emission with a variable current source as described above in FIG. 3D. Preferably, the signal path length between the splitter and the heterojunction thyristor in each channel are substantially the same. The variable current source in each channel operates in response to a control signal supplied thereto to provide a variable bias current that draws current from the injector electrode and charge from the control channel of the device as described herein. In this manner, the control signals for the channels sets the time delay between the trigger electrical pulse and the corresponding output optical pulse and output electrical pulse in each channel.

Figure 5:
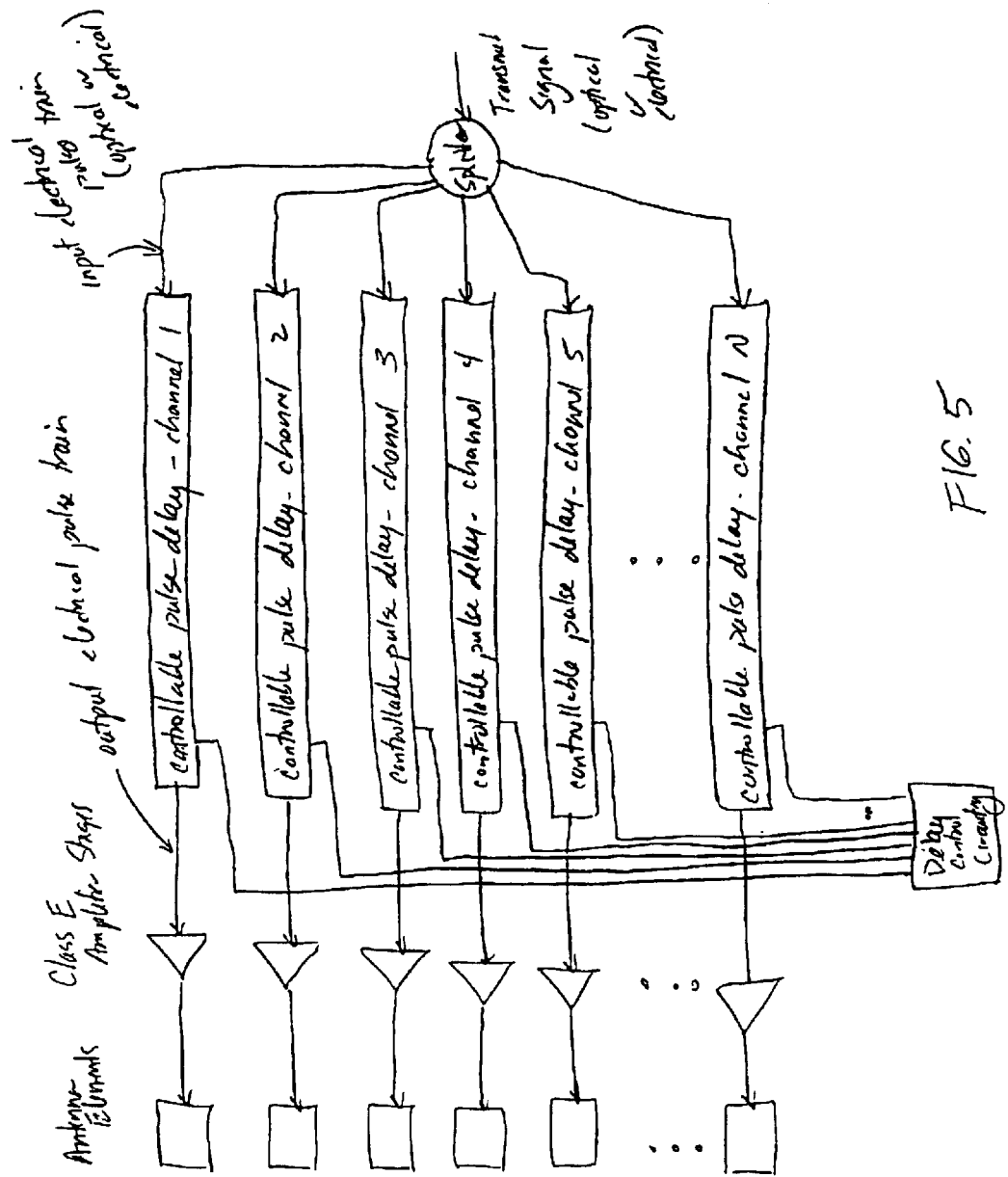
FIG. 5 illustrate an exemplary phased array transmitting system that embodies any one of the multi-channel programmable optical (or electrical) pulse delay mechanisms described above with respect to FIGS. 4A through 4D for beam steering.

The mechanisms described herein which provide programmable optical/electrical pulse delay(s) have many useful applications in state-of-the-art integrated circuits, data converters, clock synthesizers, communications timing applications, and phased array systems. FIG. 5 illustrates an exemplary phased array transmitting system that embodies any one of the multi-channel programmable optical delay mechanisms described above with respect to FIGS. 4A through 4D for beam steering. The phased array transmitting system includes a splitter that operates on a pulse modulated transmit signal to produce N identical pulsed modulated transmit signals. The transmit signal may be an optical signal, in which case the splitter is an optical splitter. Alternatively, the transmit signal may be an electrical signal, in which case the splitter is an electrical splitter. Any one of the multi-channel programmable optical delay mechanisms described above with respect to FIGS. 4A through 4D, under control of delay control circuitry, provide programmable time delays to the input pulses (optical or electrical) in the pulse modulated transmit signal provided thereto. The independent channel time delays correspond to the desired steering angle. The delayed output electrical pulse train generated by the pulse delay mechanism in each channel is provided to a class E amplifier stage in the channel to produce a high power modulated signal corresponding thereto, which is supplied to the antenna element in the channel for transmission. Class E amplifier stages are well know the art. For example, U.S. Pat. No. 3,919,656 to Sokal et al, and Section 14-3 of the textbook "Solid-state Radio Engineering" by Krause et al., Wiley and Sons, 1980, pgs. 448–454, herein incorporated by reference in their entirety, describes the operation of an exemplary Class E amplifier stages.

Figure 6:
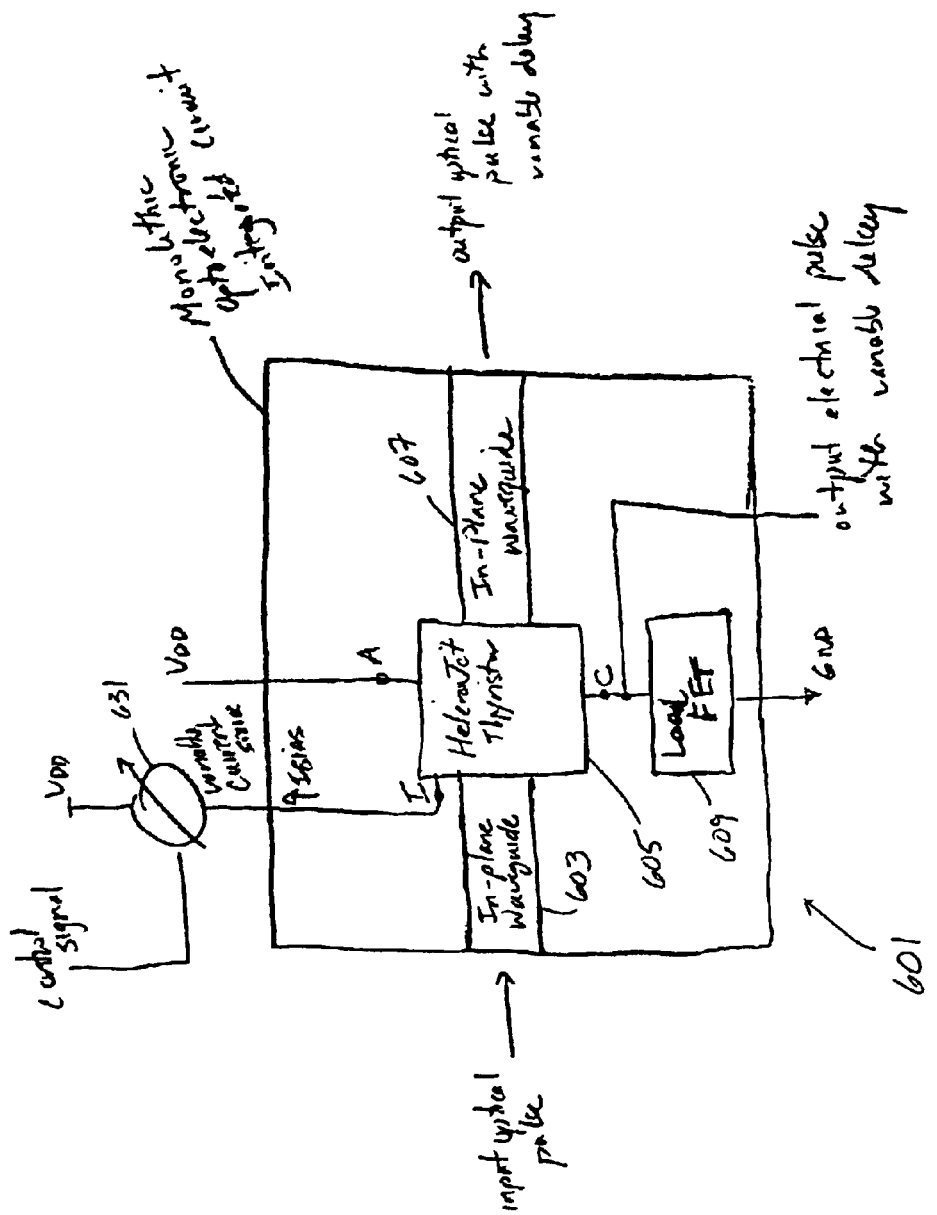
FIG. 6 is pictorial illustration of a monolithic optoelectronic integrated circuit in accordance with the present invention, including passive in-plane waveguides, a heterojunction thyristor device, and a load FET resistor integrated thereon.

FIG. 6 is pictorial illustration of a monolithic optoelectronic integrated circuit 601 in accordance with the present invention, including passive in-plane waveguides, a heterojunction thyristor device, and a load FET resistor integrated thereon. A first in-plane waveguide 603, which is coupled to an external optical source (not shown), guides an input optical pulse to the heterojunction thyristor 605 that performs the operations described above with respect to FIG. 3B to generate an output optical pulse at a delay time $t_{delay}$. The delay time $t_{delay}$ is set by a control signal operably coupled to an off-chip variable current source 631. In an alternate embodiment, the variable current source 631 can be integrated on the monolithic optoelectronic integrated circuit 601 shown. The delayed output optical pulse is provided to a second passive in-plane waveguide 607 that guides the output optical pulse to a device off-chip. Alternatively, the second passive in-plane waveguide 607 may guide the output optical pulse to another device integrated on the monolithic optoelectronic integrated circuit shown. A load FET transistor 609 is provided for biasing the heterojunction thyristor 605. Details of the heterojunction thyristor 605 are set forth above in the discussion of FIG. 2C.

Figure 7:
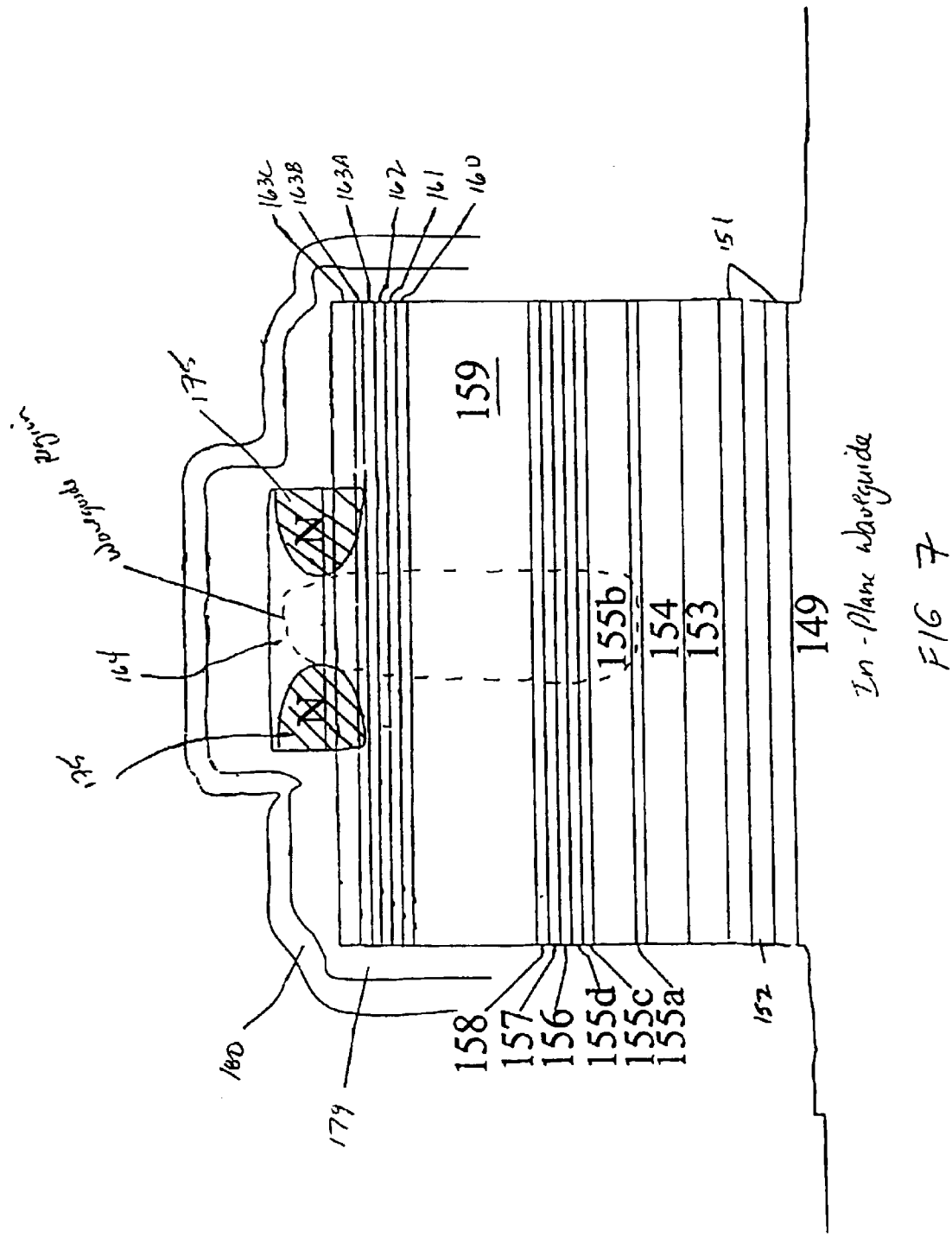
FIG. 7 is a cross-sectional schematic view showing the generalized construction of an exemplary embodiment of a passive in-plane waveguide that is part of the monolithic optoelectronic integrated circuit shown in FIG. 6.

FIG. 7 is a cross-section illustrating an exemplary embodiment of the first in-plane passive waveguide 603 and/or the second in-plane passive waveguide 607 that is part of the monolithic optoelectronic integrated circuit 601 shown in FIG. 6. The passive in-plane waveguide is formed from the structure described above with FIGS. 2A and 2B as follows. Alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Then an ion implant 175 of n-type is performed using a photomask that is aligned to the alignments marks, and an optical aperture is defined by the separation between the implants 175. The region between implants 175 defines a waveguide region as shown. Following this implant, the structure is etched down (for example, to layer 163c) near the n-type QW channel layer to form a mesa. The resulting structure is then etched to form sidewalls that traverse vertically from the surface (e.g. layer 163c) supporting the mesa down through the bottom DBR mirror (formed from layers 151/152) and into the substrate 149 as shown. A top DBR mirror is deposited on this structure. The top DBR mirror is preferably created by the deposition of one or more dielectric layer pairs (179,180), which typically comprise $SiO_2$ and a high refractive index material such as GaAs, Si, or GaN, respectively. In this configuration, light is guided laterally (e.g., in the direction out of the page) in the waveguide region by the n-type implants 175, and light is guided vertically by the top and bottom DBR mirrors that act as cladding layers.

Note that impurity disordering or similar techniques may be used in forming the passive in-plane waveguide structure to achieve a minimal change in refractive index and hence near zero reflectivity at the interface between the passive in-plane waveguides and the active heterojunction thyristor device 605, thereby resulting in very low insertion loss.

Figure 8:
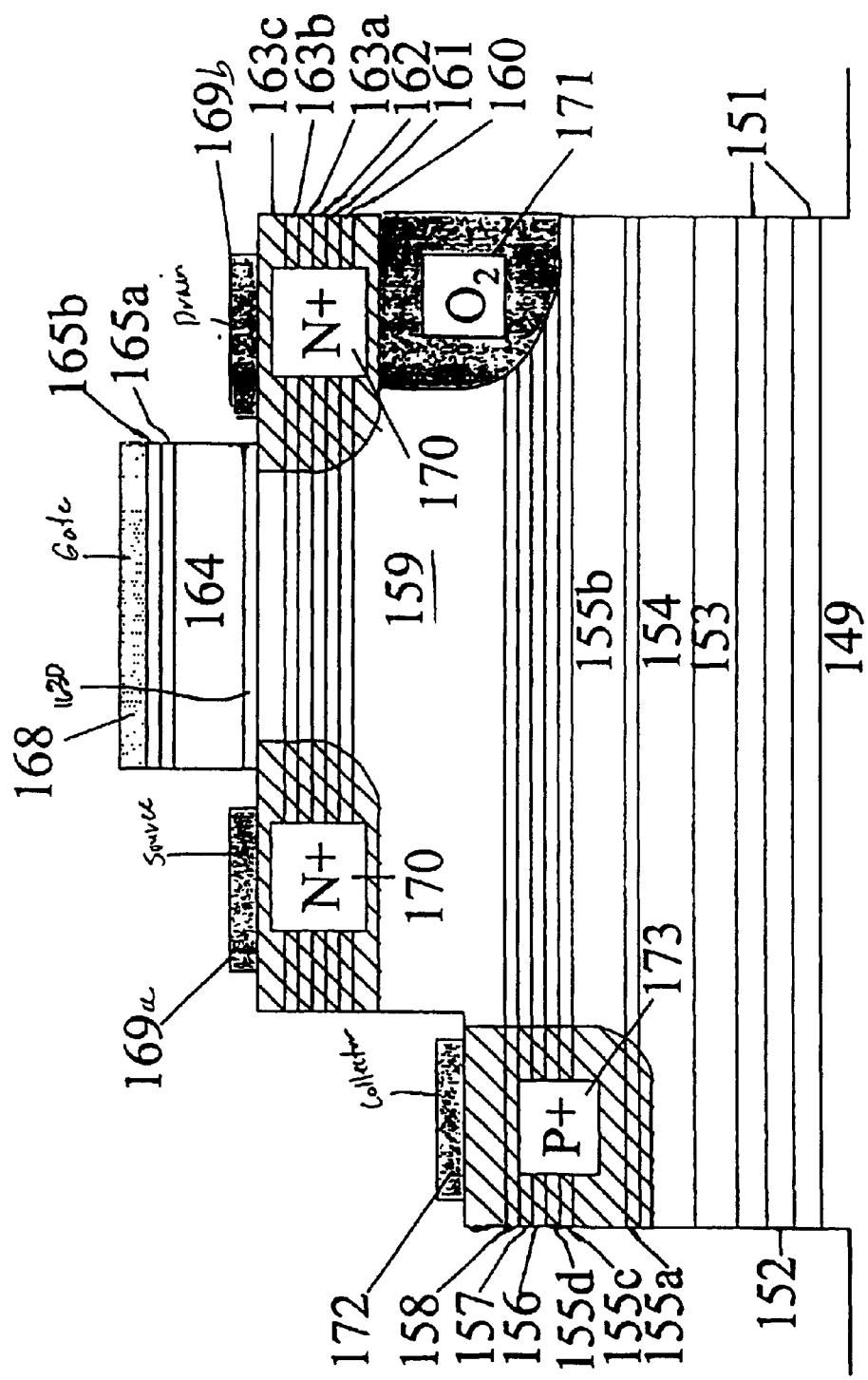
FIG. 8 is a cross-sectional schematic view showing the generalized construction of an exemplary embodiment of an n-type HFET load resistor that is part of the monolithic optoelectronic integrated circuit shown in FIG. 6.

FIG. 8 is a cross-section illustrating an exemplary embodiment of an n-channel HFET (NHFET) load resistor 609 that is part of the monolithic optoelectronic integrated circuit 601 shown in FIG. 6. The NHFET load resistor 609 is formed from the structure described above with FIGS. 2A and 2B. In addition, an ohmic metal gate electrode 168 is deposited on P+ ohmic contact layer 165b. The structure outside the gate electrode is etched down to near (for example, to layer 163c) the n-type QW channel consisting of the layers 161 and 160. An ion implant 170 of n-type ions forms a self-aligned contacts to the n-type QW channel. On the source side of the NHFET, the resulting structure is etched down near (for example, to layer 159 at a point about 1000 Å above) the p-type QW structure 157. An ion implant 173 of p-type ions is performed to contact the p-type QW inversion channel. Also an insulating implant 171 (utilizing, for example, oxygen as shown) is performed under the n-type ion implant for the drain to reduce the capacitance for high speed operation. An insulating implant (not shown) may also be performed under the p+-type implant 173 for this same purpose. Next the device is subjected to a rapid thermal anneal (RTA) of the order of 900° C. or greater to activate all implants. Then the device is isolated from other devices by an etch down to the semi-insulating substrate 149, which includes an etch through the mirror pairs 151/152 of AlAs/GaAs. At this point, the device is oxidized in a steam ambient to create layers of AlO/GaAs (not shown), which form the top DBR mirror and which are not part of the active layers of this device). During this oxidation step, the exposed sidewalls of the etched AlGaAs layers are passivated by the formation of very thin layers of oxide. The final step in the fabrication is the deposition (preferably via lift off) of Au metal contacts. These contacts come in three forms. One is the AuGe/Ni/Au contact 169 (169A, 169B) for the N+ type implants 170, one is the AuZn/Cr/Au contact 172 for the P+ type implant 173 and the third is a final layer of pure Au (not shown) to form interconnect between device nodes. In the circuit of FIG. 7, the NHFET device is configured as a load resistor whereby the gate is connected to the drain of the device. In this configuration, the third contact layer of pure Au connects the gate electrode 168 to the drain electrode 169 to form a load resistor.

Figure 9:
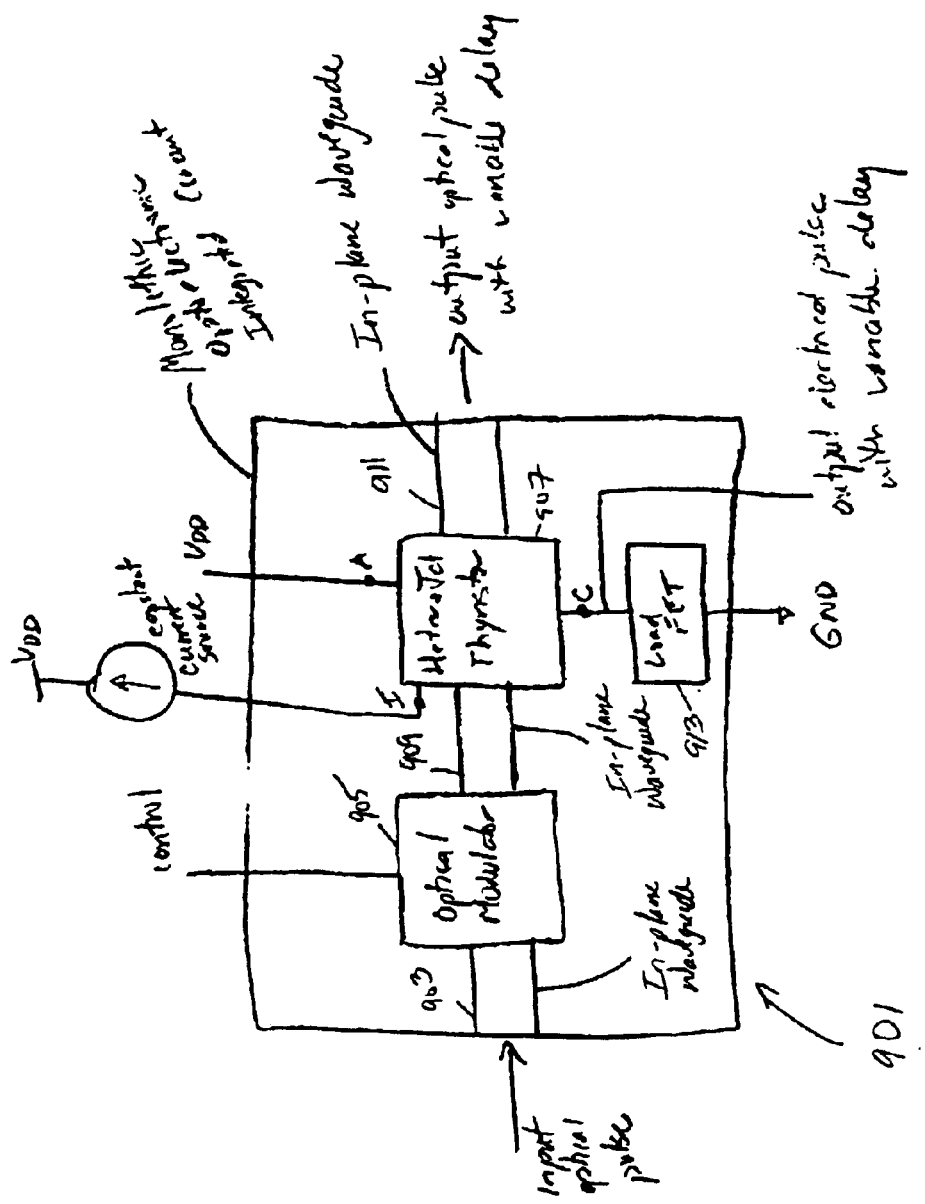
FIG. 9 is pictorial illustration of a monolithic optoelectronic integrated circuit in accordance with the present invention, including passive in-plane waveguides, an analog optical modulator, a heterojunction thyristor device, and a load FET resistor integrated thereon.

FIG. 9 is pictorial illustration of a monolithic optoelectronic integrated circuit 901 in accordance with the present invention, including passive in-plane waveguides, an analog optical modulator, a heterojunction thyristor device, and a load FET resistor integrated thereon. A first in-plane waveguide 901, which is coupled to an external optical source (not shown), guides an input optical pulse to analog optical modulator 905, which is optically coupled to heterojunction thyristor 907 via a second passive in-plane waveguide 909. The analog optical modulator 905 and heterojunction thyristor 907 perform the operations described above with respect to FIG. 3A to generate an output optical pulse at a delay time $t_{delay}$. The delay time $t_{delay}$ is set by a control signal operably coupled to the optical modulator 905. The delayed output optical pulse is provided to a third passive in-plane waveguide 911 that guides the output optical pulse to a device off-chip. Alternatively, the third passive in-plane waveguide 911 may guide the output optical pulse to another device integrated on the monolithic optoelectronic integrated circuit shown. A load transistor 913 is provided for biasing the heterojunction thyristor 907. Details of the heterojunction thyristor 907 are set forth above in the discussion of FIG. 2C. Details of the passive in-plane waveguides are set forth above in the discussion of FIG. 7. Details of the load resistor are set forth above in the discussion of FIG. 8.

Figure 10:
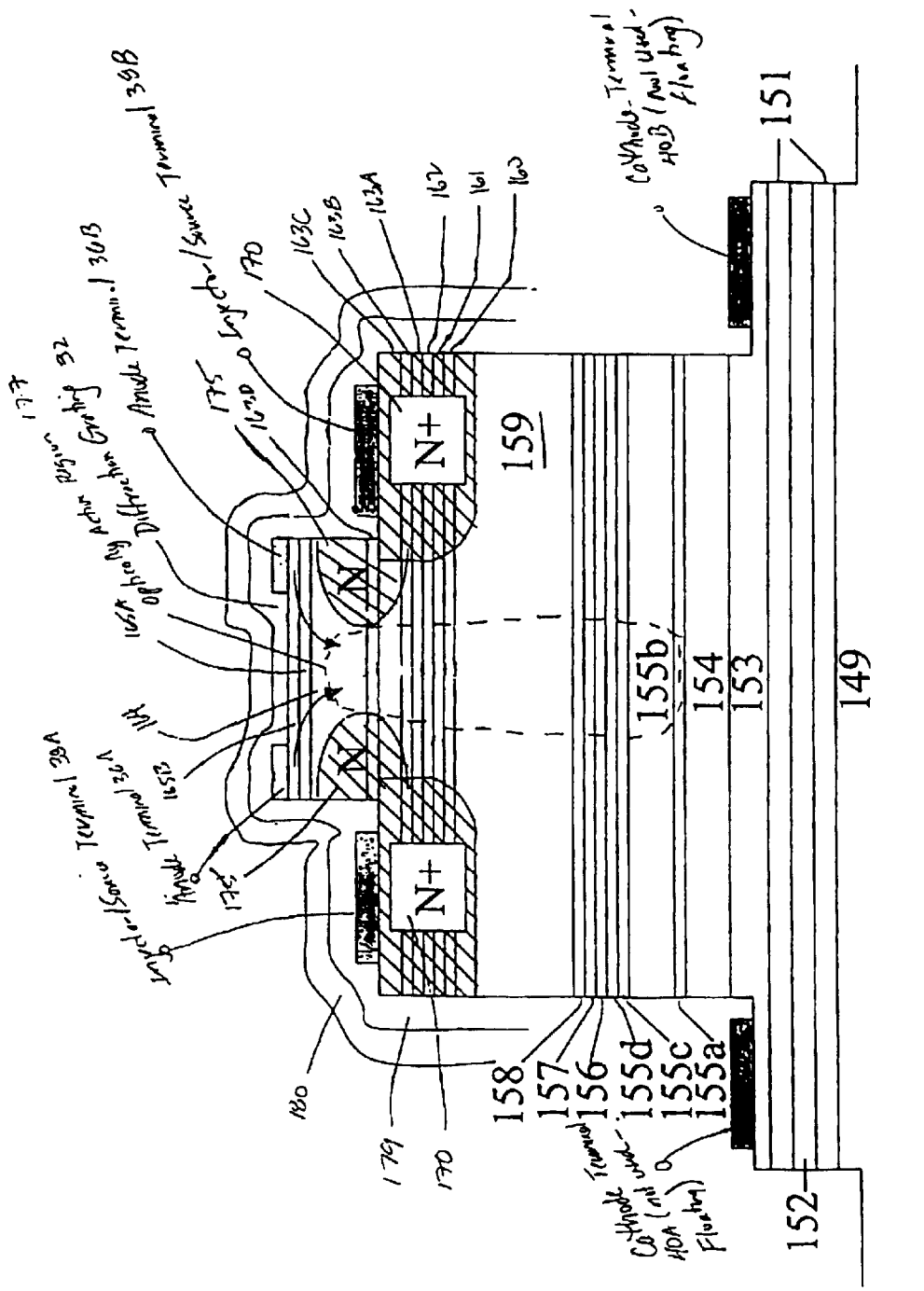
FIG. 10 is a cross-sectional schematic view showing the generalized construction of an exemplary embodiment of an analog optical modulator that is part of the monolithic optoelectronic integrated circuit shown in FIG. 6.

FIG. 10 is a cross-section illustrating an exemplary embodiment of an analog optical modulator 905 that is part of the monolithic optoelectronic integrated circuit 901 shown in FIG. 9. The analog optical modulator 905 is formed from the structure of the heterojunction thyristor as described above with FIGS. 2A, 2B and 2C in detail. To configure the heterojunction thyristor structure as an analog optical modulator, the cathode terminal floats electrically and the thyristor function is deactivated. An optical path is provided through the device, and an input signal is applied to the anode terminals 36A, 36B with respect to the injector/source terminals 38A,38B such that the anode terminals 36A,36B are biased positively with respect to the injector/source terminals 38A,38B. In this configuration, the voltage at the anode terminals 36A,36B is varied over a range of voltage levels where absorption of the device varies linearly. The top of the voltage range (where minimum absorption occurs) is defined by the operation point where conduction occurs from the anode terminals 36A, 36B to the injector/source terminals 38A,38B.

To form the analog optical modulator 905, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Then an ion implant 175 of n-type is performed using a photomask that is aligned to the alignments marks, and an optical aperture is defined by the separation between the implants 175. The implants 175 create a p-n junction in the layers between the n-type quantum wells and the surface, and the aperture between the implants defines the region in which the current may flow, and therefore the optically active region 177 as shown. The current cannot flow into the n-type implanted regions 175 because of the barrier to current injection. The current flow trajectory is shown in FIG. 10 as arrows. Following the implant, the ohmic metal anode terminals 36A and 36B (which collectively form the anode terminal 36 of the device) are deposited and defined.

N+ ion implants 170 are used to form self-aligned channel contacts to the n-type QW inversion channel(s). More specifically, the N+ implants are used as an etch stop to form a mesa via etching down (for example, to layer 163c) near the n-type QW channel(s). The N+ ion implants 170 are electrically coupled to the injector terminals 38A and 38B (which collectively form the injector terminal 38 of the device). The injector terminals 38A and 38B are preferably formed via deposition of an n-type Au alloy metal on the N+ ion implants 170 to form ohmic contacts thereto.

The cathode terminals 40A and 40B (which collectively form the cathode terminal 40 of the device) may be formed by etching to the N+ bottom layer 153, and depositing a metal layer (for example AuGe/Ni/Au) to form an ohmic contact to N+ bottom layer 153. However, the cathode terminals 40A and 40B are not active parts of this device and thus float electrically. Alternatively, the etch step down to the N+ ohmic contact layer 153 and subsequent deposition of the cathode terminal metal layer may be omitted. The resulting structured is isolated from other devices by etching down to the substrate 149. The structure is then subject to rapid thermal anneal (RTA) to activate the implants.

To form a device suitable for in-plane optical injection into a resonant vertical cavity and/or in-plane optical emission from the resonant vertical cavity, a diffraction grating 32 and top DBR mirror is deposited on this structure as described above. To form a device suitable for vertical optical injection into (and/or optical emission from) a resonant vertical cavity, the diffraction grating 32 is omitted. The top DBR mirror is preferably created on the top of the device by the deposition of one or more dielectric layer pairs (179,180), which typically comprise $SiO_2$ and a high refractive index material such as GaAs, Si or GaN, respectively.

Advantageously, the variable pulse delay mechanisms utilizing one or more heterojunction thyristor devices as described herein are less costly to manufacture than prior art devices because they can be easily integrated with other optoelectronic devices such as optical emitters, optical detectors, optical modulators, optical amplifiers, and transistors.

There have been described and illustrated herein several embodiments of a variable pulse delay mechanism utilizing one or more heterojunction thyristor devices and monolithic optoelectronic integrated circuits that include such variable pulse delay mechanisms. While particular embodiments of the invention have been described, it is not intended that the invention be limited thereto, as it is intended that the invention be as broad in scope as the art will allow and that the specification be read likewise. Thus, while particular group III-V heterostructures have been disclosed, it will be appreciated that other heterostructures (such as strained silicon-germanium (SiGe) heterostructures) can be used to realize the heterojunction thyristor devices described herein, the variable pulse delay mechanisms utilizing such heterojunction thyristor devices, and monolithic optoelectronic integrated circuits that include such variable pulse delay mechanisms. It will therefore be appreciated by those skilled in the art that yet other modifications could be made to the provided invention without deviating from its spirit and scope as claimed.

What is claimed is:

1. An optoelectronic integrated circuit comprising:

a) a substrate;

b) a resonant cavity formed on said substrate;

c) a heterojunction thyristor device, formed in said resonant cavity, that detects a trigger pulse comprising at least one of an input optical pulse and an input electrical pulse and that produces both an output optical pulse via laser emission for output outside said resonant cavity and an output electrical pulse in response to said detected trigger pulse; and d) delay means for dynamically varying time delay between said trigger pulse and both said output optical pulse and said output electrical pulse wherein said heterojunction thyristor device comprises at least one modulation doped quantum well structure comprising a quantum well, an undoped spacer layer disposed adjacent said quantum well and a relatively thin and doped charge sheet disposed adjacent said spacer layer opposite said quantum well.

2. An optoelectronic integrated circuit according to claim 1, wherein:
said modulation doped quantum well structure defines a channel region operably coupled to a current source that draws constant current from said channel region, and
said delay means modulates intensity of said trigger pulse to dynamically vary said time delay.

3. An optoelectronic integrated circuit according to claim 1, wherein:
said modulation doped quantum well structure defines a channel region operably coupled to a current source that draws current from said channel region, and
said delay means controls the amount of current drawn from said channel region by said current source to dynamically vary said time delay.

4. An optoelectronic integrated circuit according to claim 1, wherein:
said heterojunction thyristor device is formed from a multilayer structure of group III-V materials.

5. An optoelectronic integrated circuit according to claim 1, wherein:
said heterojunction thyristor device is formed from a multilayer structure of strained silicon materials.

6. An optoelectronic integrated circuit according to claim 1, wherein:
said heterojunction thyristor device further comprises a p-channel FET transistor formed on said substrate and an n-channel FET transistor formed atop said p-channel FET transistor.

7. An optoelectronic integrated circuit according to claim 6, wherein:
said p-channel FET transistor comprises a p-type modulation doped quantum well structure, and wherein said n-channel FET transistor comprises an n-type modulation doped quantum well structure.

8. An optoelectronic integrated circuit according to claim 7, wherein:
said p-channel FET transistor includes a bottom active layer,
said n-channel FET transistor includes a top active layer, and
said heterojunction thyristor device further comprises an anode terminal operably coupled to said top active layer, a cathode terminal operably coupled to said bottom active layer, and an injector terminal operably coupled to at least one of said n-type modulation doped quantum well structure and said p-type modulation doped quantum well structure.

9. An optoelectronic integrated circuit according to claim 8, wherein:
said heterojunction thyristor device further comprises an ohmic contact layer, a metal layer for said anode terminal that is formed on said ohmic contact layer, and a plurality of p-type layers formed between said ohmic contact layer and said n-type modulation doped quantum well structure.

10. An optoelectronic integrated circuit according to claim 8, wherein:
said plurality of p-type layers are separated from said n-type modulation doped quantum well structure by undoped spacer material.

11. An optoelectronic integrated circuit according to claim 8, wherein:
said plurality of p-type layers include a top sheet and bottom sheet of planar doping of highly doped p-material separated by a moderately doped layer of p-material, whereby said top sheet achieves low gate contact resistance and said bottom sheet defines the capacitance of said n-channel FET transistor.

12. An optoelectronic integrated circuit according to claim 8, wherein:
said heterojunction thyristor device is configured as an optical detector/modulator by
i) a current source operably coupled to said injector terminal that draws bias current from said quantum well structure coupled thereto, and
ii) a load resistor operably coupled to said cathode terminal that biases said heterojunction thyristor device such that a forward bias exists between said anode and cathode terminals that is less than maximum forward breakdown voltage of the heterojunction thyristor device.

13. An optoelectronic integrated circuit according to claim 12, wherein:
said heterojunction thyristor device is configured as an optical detector/laser emitter such that, when an incident optical pulse of sufficient intensity produces photocurrent in said quantum well channel in excess of said bias current that results in a channel charge exceeding critical switching charge, said heterojunction thyristor device will switch to the ON state whereby current through the heterojunction thyristor device is above threshold for lasing.

14. An optoelectronic integrated circuit according to claim 1, wherein:
said resonant cavity comprises a bottom distributed bragg reflector mirror and a top distributed bragg reflector mirror.

15. An optoelectronic integrated circuit according to claim 14, wherein:
an optical aperture in said top distributed bragg reflector mirror injects incident light into said resonant cavity, wherein light produced in said resonant cavity is emitted through said optical aperture.

16. An optoelectronic integrated circuit according to claim 14, further comprising:
a diffraction grating formed under said top distributed bragg reflector mirror, wherein said diffraction grating injects incident light that is propagating along an in-plane direction into the resonant cavity, and emits light produced in the resonant cavity along an in-plane direction.

17. A monolithic optoelectronic integrated circuit comprising:
a) a substrate;
b) a first resonant cavity formed on said substrate;
c) a first diffraction grating formed in said first resonant cavity;
d) a first heterojunction thyristor device, formed in said first resonant cavity;
e) first and second passive in-plane waveguides formed on said substrate; and
f) a load FET transistor formed on said substrate;
wherein said first passive in-plane waveguide guides an input optical pulse to said first heterojunction thyristor device, wherein said first heterojunction thyristor device detects said input optical pulse and produces an output optical pulse via laser emission in response to the detected input optical pulse, wherein said first diffraction grating directs said output optical pulse to said second passive in-plane waveguide for optical communication to other devices, and wherein said load FET transistor provides biasing of said first heterojunction thyristor device.

18. A monolithic optoelectronic integrated circuit according to claim 17, further comprising:

delay means for controllably varying time delay between said optical input pulse and said output optical pulse.

19. A monolithic optoelectronic integrated circuit according to claim 18, wherein:

said first heterojunction thyristor device includes a channel region operably coupled to a current source that draws current from said channel region, and said delay means regulates amount of current drawn from said channel region by said current source to controllably vary said time delay.

20. A monolithic optoelectronic integrated circuit according to claim 19, wherein:

said current source is integrated on said substrate.

21. A monolithic optoelectronic integrated circuit according to claim 18, wherein:

said first heterojunction thyristor device includes a channel region operably coupled to a current source that draws constant current from said channel region, and said delay means modulates intensity of said input optical pulse to controllably vary said time delay.

22. A monolithic optoelectronic integrated circuit according to claim 18, further comprising:

g) a second resonant cavity formed on said substrate;

h) a second diffraction grating formed in said second resonant cavity; and i) a second heterojunction thyristor device, formed in said second resonant cavity, that is configured as analog optical modulator that controllably modulates intensity level of incident light to provide a modulated input optical pulse to said first heterojunction thyristor.

23. A monolithic optoelectronic integrated circuit according to claim 22, wherein said current source is integrated on said substrate.

24. An optoelectronic integrated circuit according to claim 1, wherein:

said heterojunction thyristor device further comprises a p-type quantum-well-base bipolar transistor formed on said substrate and an n-type quantum-well-base bipolar transistor formed atop said p-type quantum-well base bipolar transistor.

25. An optoelectronic integrated circuit according to claim 24, wherein:

said p-type quantum-well-base bipolar transistor comprises a modulation doped p-type quantum well structure, and wherein said n-type quantum-well-base bipolar transistor comprises a modulation doped n-type quantum well structure.

26. An optoelectronic integrated circuit according to claim 1, wherein:

said modulation doped quantum well structure defines a channel region operably coupled to a control terminal electrode; and at least one current source that is operably coupled to said control terminal electrode, said at least one current source adapted to control supply of electrical charge in said channel region during operation of said heterojunction thyristor device.

27. A monolithic optoelectronic integrated circuit according to claim 17, wherein:

said first heterojunction thyristor device comprises a channel region operably coupled to a control terminal electrode; and at least one current source that is operably coupled to said control terminal electrode, said at least one current source adapted to control supply of electrical charge in said channel region during operation of said first heterojunction thyristor device.

28. An optoelectronic integrated circuit comprising:

a) a substrate;

b) a resonant cavity formed on said substrate;

c) a thyristor device, formed in said resonant cavity, that detects a trigger pulse comprising at least one of an input optical pulse and an input electrical pulse and that produces both an output optical pulse via laser emission for output outside said resonant cavity and an output electrical pulse in response to said detected trigger pulse, said thyristor device comprising an anode terminal electrode, a cathode terminal electrode, and at least one control terminal electrode; and d) delay means for dynamically varying time delay between said trigger pulse and both said output optical pulse and said output electrical pulse, said delay means comprising at least one of:

i) a current source, operably coupled to said control electrode, that is adapted to provide a varying amount of current to said control electrode; and ii) means for dynamically modulating intensity of said trigger pulse.

29. An optoelectronic integrated circuit according to claim 28, wherein:

said thyristor device comprises at least one modulation doped quantum well structure comprising a quantum well, an undoped spacer layer disposed adjacent said quantum well and a relatively thin and doped charge sheet disposed adjacent said spacer layer opposite said quantum well.

30. An optoelectronic integrated circuit according to claim 29, wherein:

said thyristor device comprises an n-type modulation doped quantum well structure and a p-type modulation doped quantum structure.

* * * * *